United States Patent
Nakamura et al.

(10) Patent No.: US 7,947,956 B2
(45) Date of Patent: May 24, 2011

(54) FLUORESCENT MATERIAL, A METHOD OF MANUFACTURING THE FLUORESCENT MATERIAL, A RADIATION DETECTOR USING THE FLUORESCENT MATERIAL, AND AN X-RAY CT SCANNER

(75) Inventors: Ryouhei Nakamura, Tokorozawa (JP); Nobuyuki Yamada, Hanyu (JP); Akio Miyamoto, Hokuto (JP)

(73) Assignee: Hitachi Metals, Ltd., Tokyo (JP)

( * ) Notice: Subject to any disclaimer, the term of this patent is extended or adjusted under 35 U.S.C. 154(b) by 61 days.

(21) Appl. No.: 12/379,849

(22) Filed: Mar. 3, 2009

(65) Prior Publication Data

US 2009/0261255 A1  Oct. 22, 2009

Related U.S. Application Data

(63) Continuation of application No. 11/722,413, filed as application No. PCT/JP2005/023347 on Dec. 20, 2005, now Pat. No. 7,595,492.

(30) Foreign Application Priority Data

Dec. 21, 2004 (JP) ................................. 2004-369103
Feb. 28, 2005 (JP) ................................. 2005-053335

(51) Int. Cl.
*G01T 1/20* (2006.01)
*C09K 11/08* (2006.01)
(52) U.S. Cl. ............................ 250/361 R; 252/301.4 R
(58) Field of Classification Search .............. 250/361 R, 250/370.11, 301.4 F, 301.4 R; 252/301.4 R
See application file for complete search history.

(56) References Cited

U.S. PATENT DOCUMENTS

| 4,314,910 | A | * | 2/1982 | Barnes ................... 252/301.4 R |
| 4,508,636 | A | | 4/1985 | Ochiai |
| 7,076,020 | B2 | * | 7/2006 | Kanai et al. ...................... 378/19 |
| 7,436,066 | B2 | * | 10/2008 | Sonobe et al. ................ 257/767 |
| 2003/0141484 | A1 | | 7/2003 | Yamada et al. |

FOREIGN PATENT DOCUMENTS

| EP | 1 347 032 A1 | 9/2003 |
| JP | 63-309583 | 12/1988 |
| JP | 04-289483 A | 10/1992 |
| JP | 09-20599 A | 1/1997 |
| JP | 2001-004753 A | 1/2001 |

(Continued)

OTHER PUBLICATIONS

Jennifer L. Wu et al., Spectral Properties of Various Cerium Doped Garnet Phosphors for Application in White GaN-based LEDs, Mat. Res. Soc. Symp. Proc., vol. 658, Jan. 1, 2001, Materials Research Society, USA.

*Primary Examiner* — David P Porta
*Assistant Examiner* — Faye Boosalis
(74) *Attorney, Agent, or Firm* — Paul F. Neils, Esq.; Akerman Senterfitt

(57) ABSTRACT

Scintillator with both high fluorescence intensity and weak afterglow, can be offered.
An aspect in accordance with the present invention provides, a fluorescent material with garnet structure containing Gd, Al, Ga, and O at least, containing Lu and/or Y, and also containing Ce as an activator, wherein said fluorescent material is expressed as $(Gd_{1-x-z}L_xCe_z)_{3+a}(Al_{1-u}Ga_u)_{5-a}O_{12}$, wherein L is Lu and/or Y, wherein $0<a\leq0.15$, $0<x<1.0$, $0.0003\leq z\leq0.0167$ (here, $x+z<1.0$), and $0.2\leq u\leq0.6$.

6 Claims, 13 Drawing Sheets

| | FOREIGN PATENT DOCUMENTS | | |
|---|---|---|---|
| JP | 2001-183463 A | 7/2001 | |
| JP | 2001-294853 A | 10/2001 | |
| JP | 2001-303048 A | 10/2001 | |
| JP | 2002-189080 A | 7/2002 | |
| JP | 2003-027057 | 1/2003 | |
| JP | 2003-27057 A | 1/2003 | |
| JP | 2003-119070 A | 4/2003 | |
| JP | 2004-47196 A | 2/2004 | |
| JP | 2004-189783 A | 7/2004 | |
| JP | 2005-95514 A | 4/2005 | |
| JP | 2005-126718 | 5/2005 | |
| WO | WO 99/33934 A1 | 7/1999 | |
| WO | WO 2004/084261 A2 | 9/2004 | |

\* cited by examiner

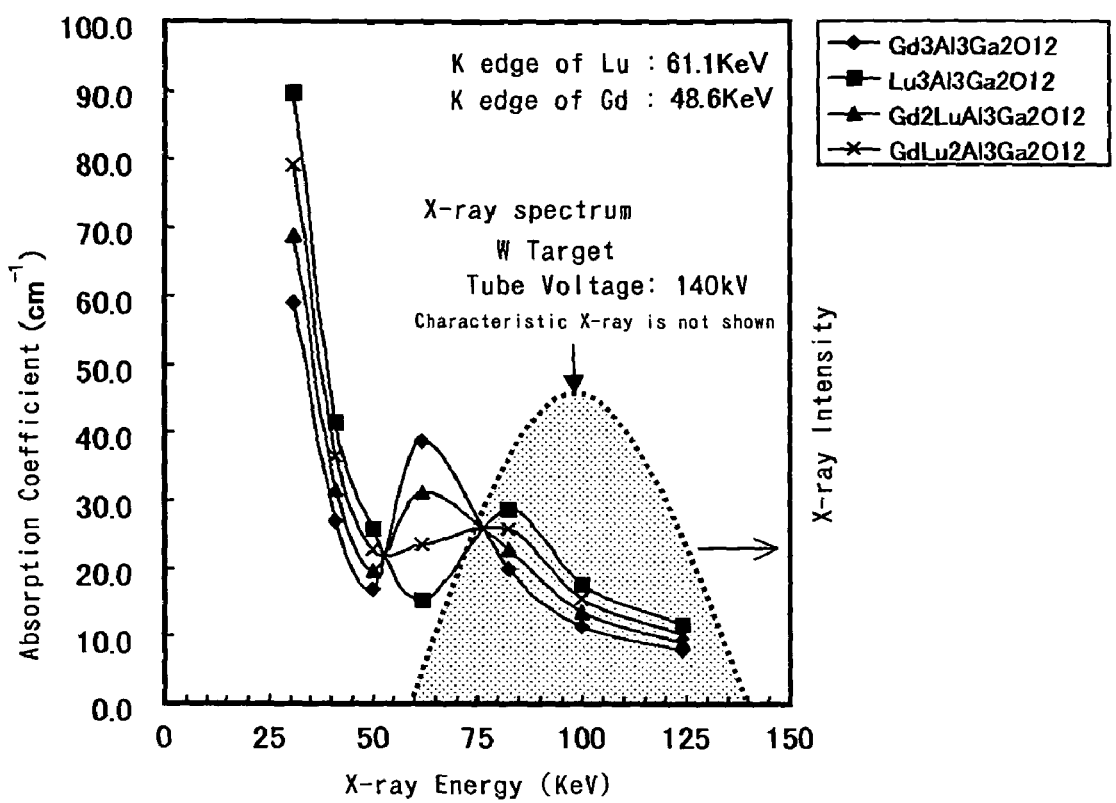
[Fig.1]

[Fig.2]
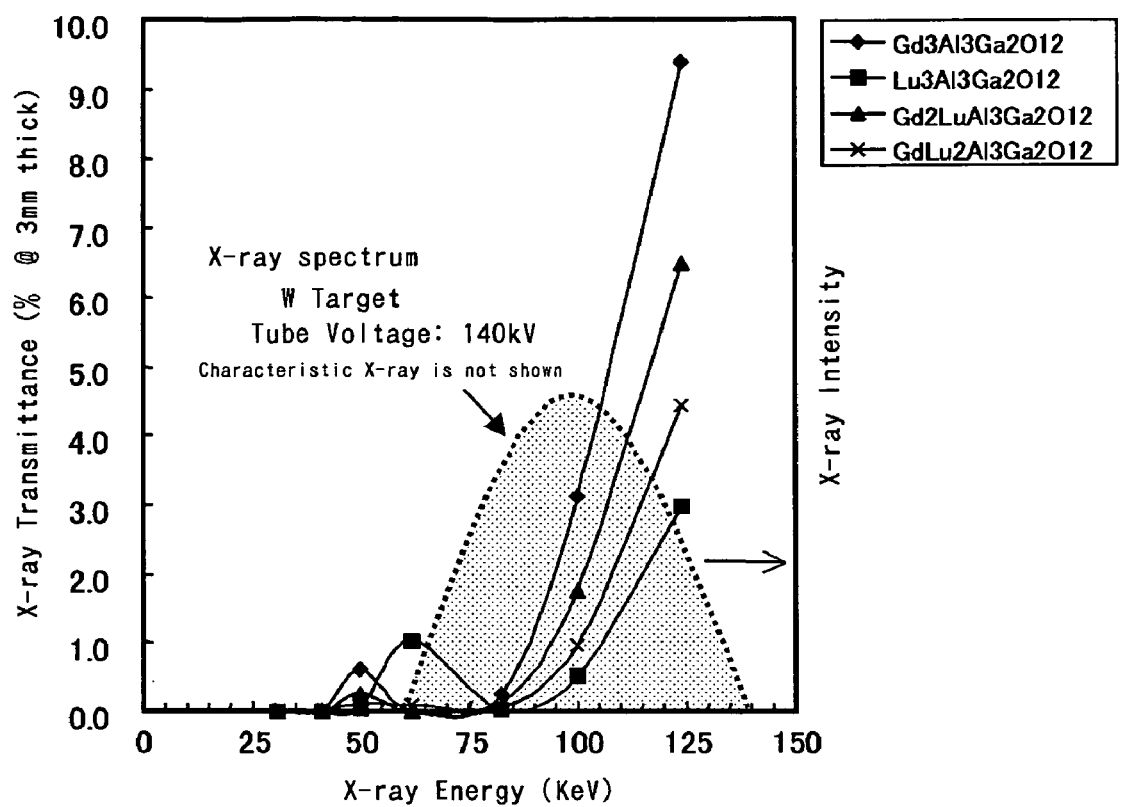

[Fig.3]
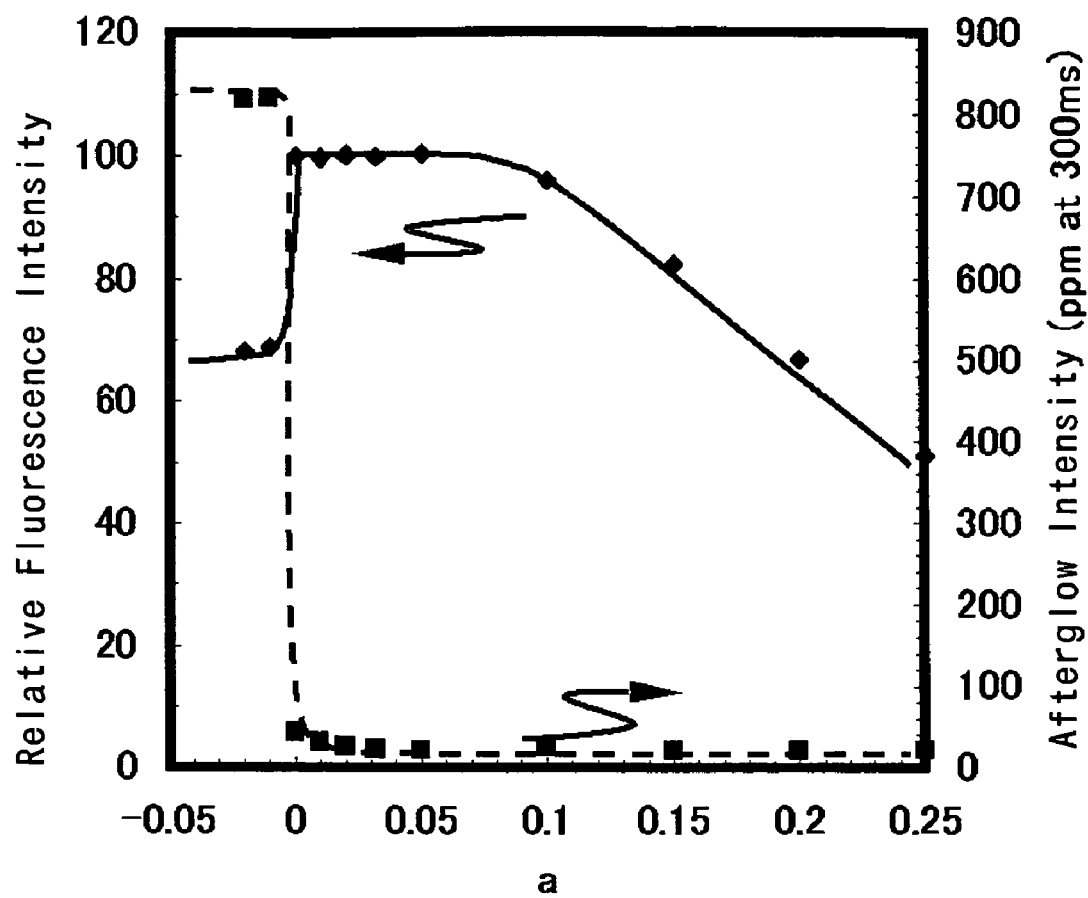

[Fig.4]
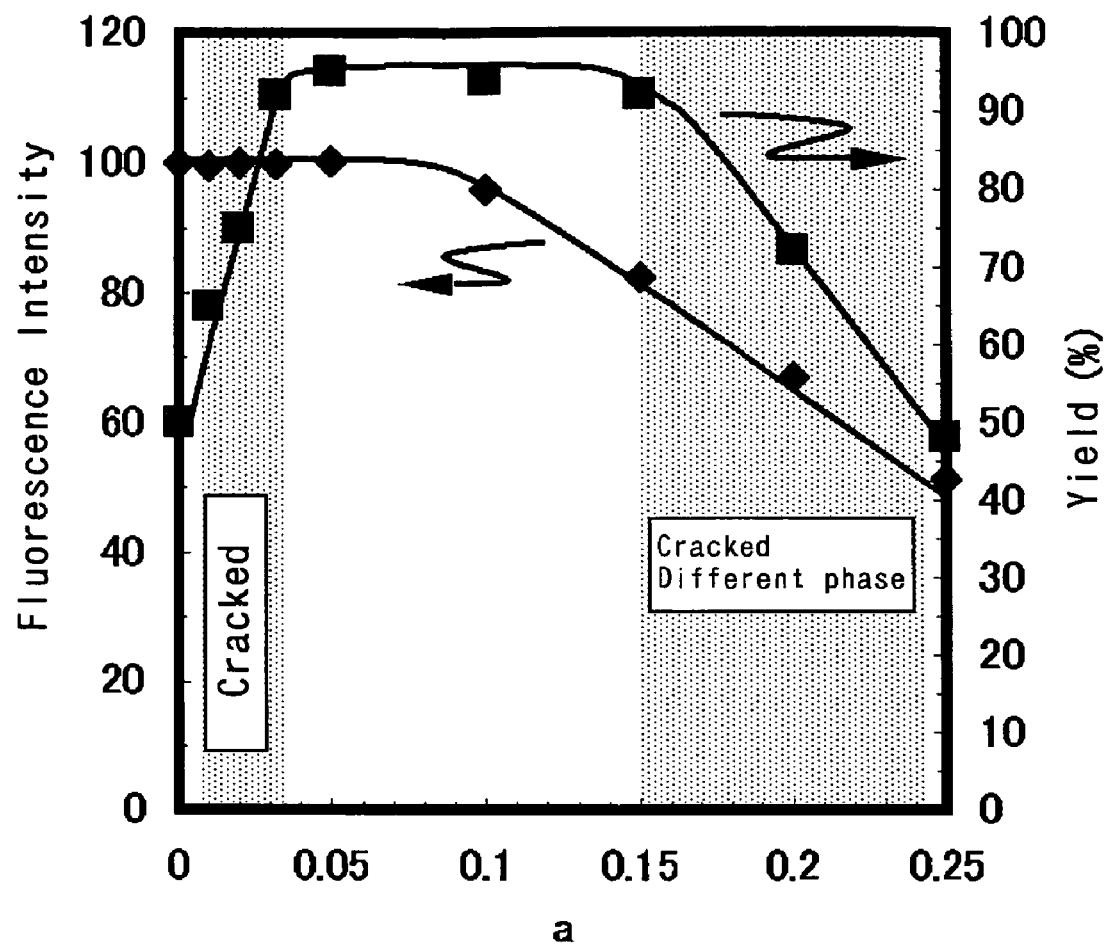

[Fig.5]
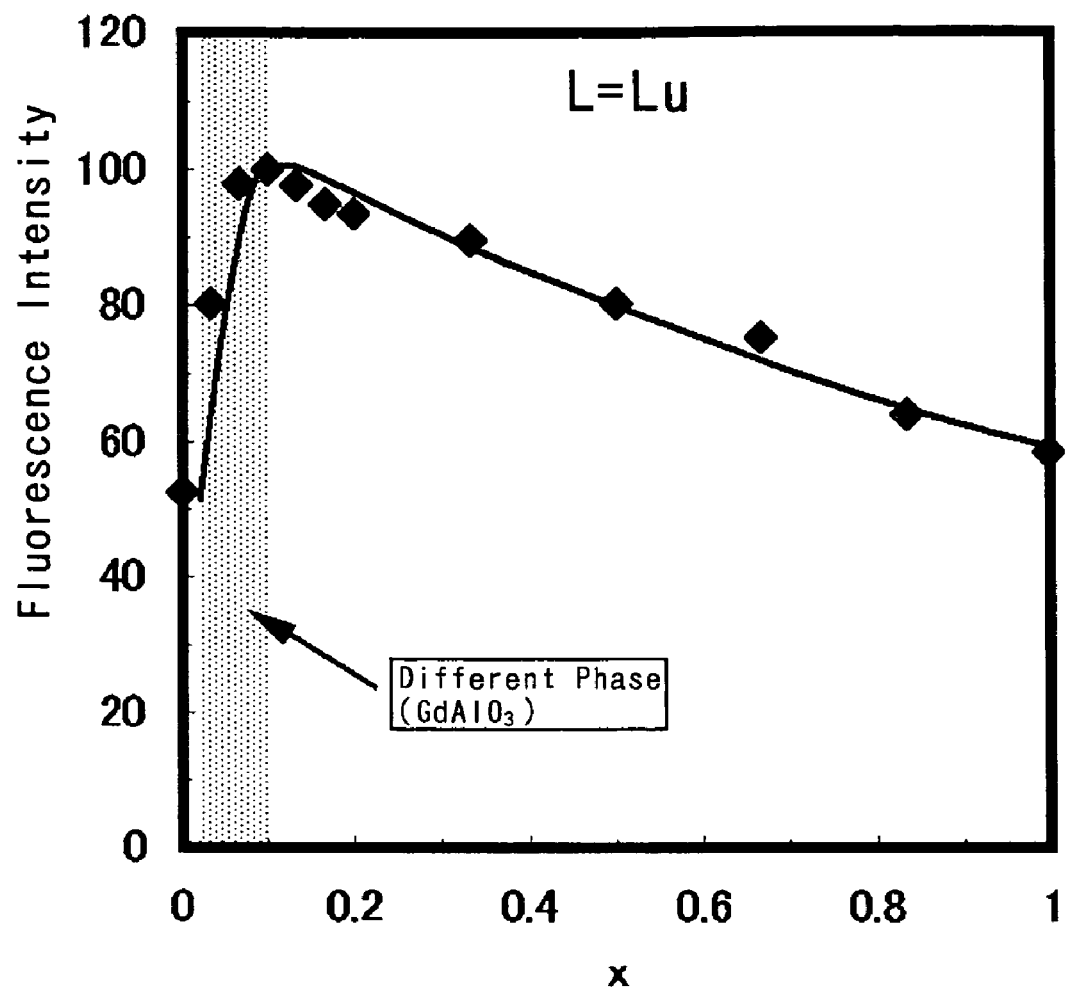

[Fig.6]
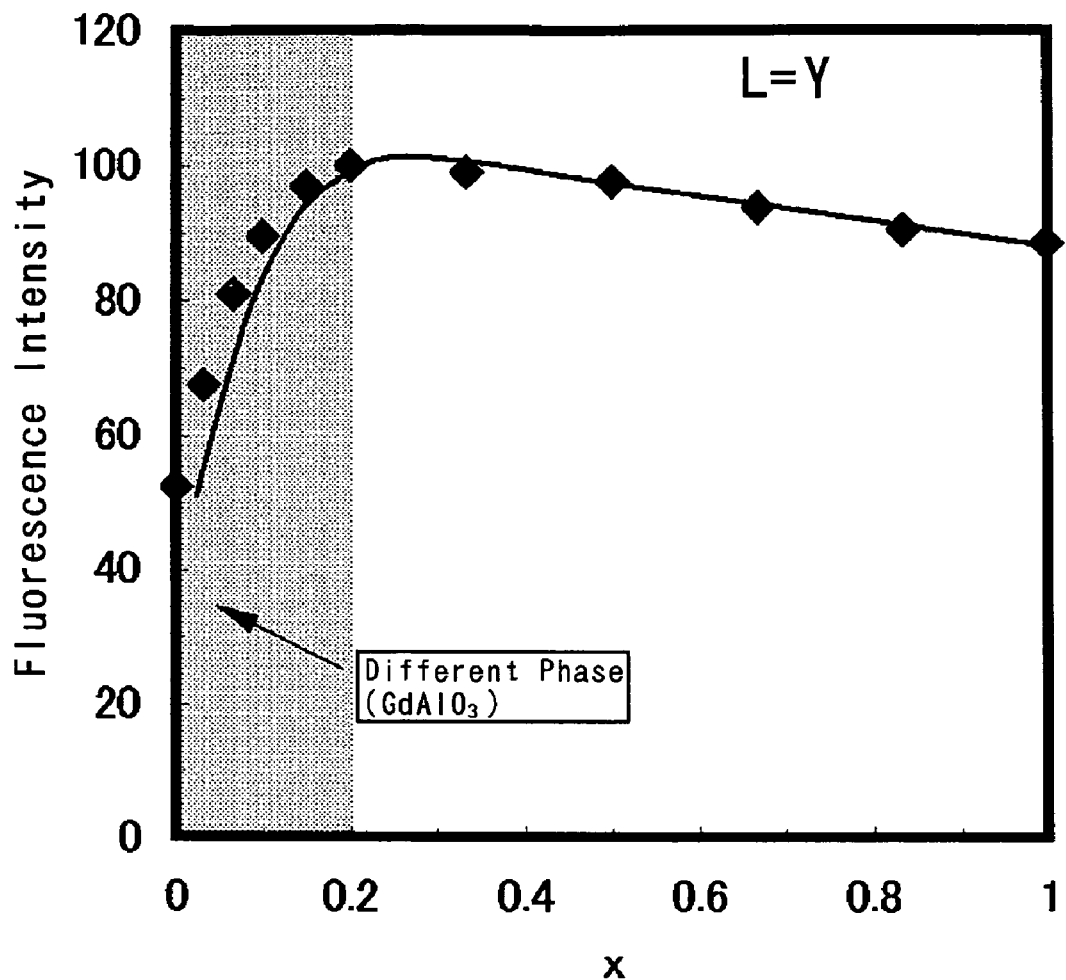

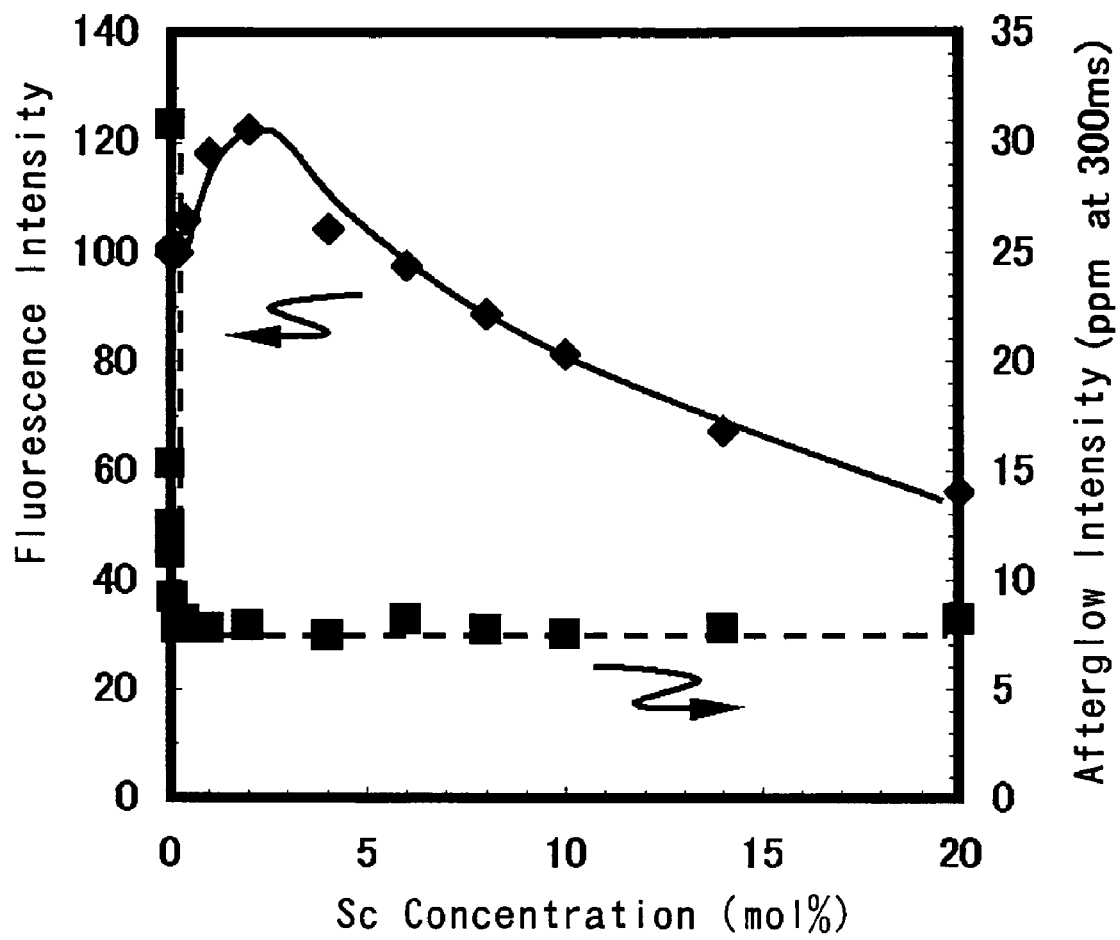
[Fig.7]

[Fig.8]
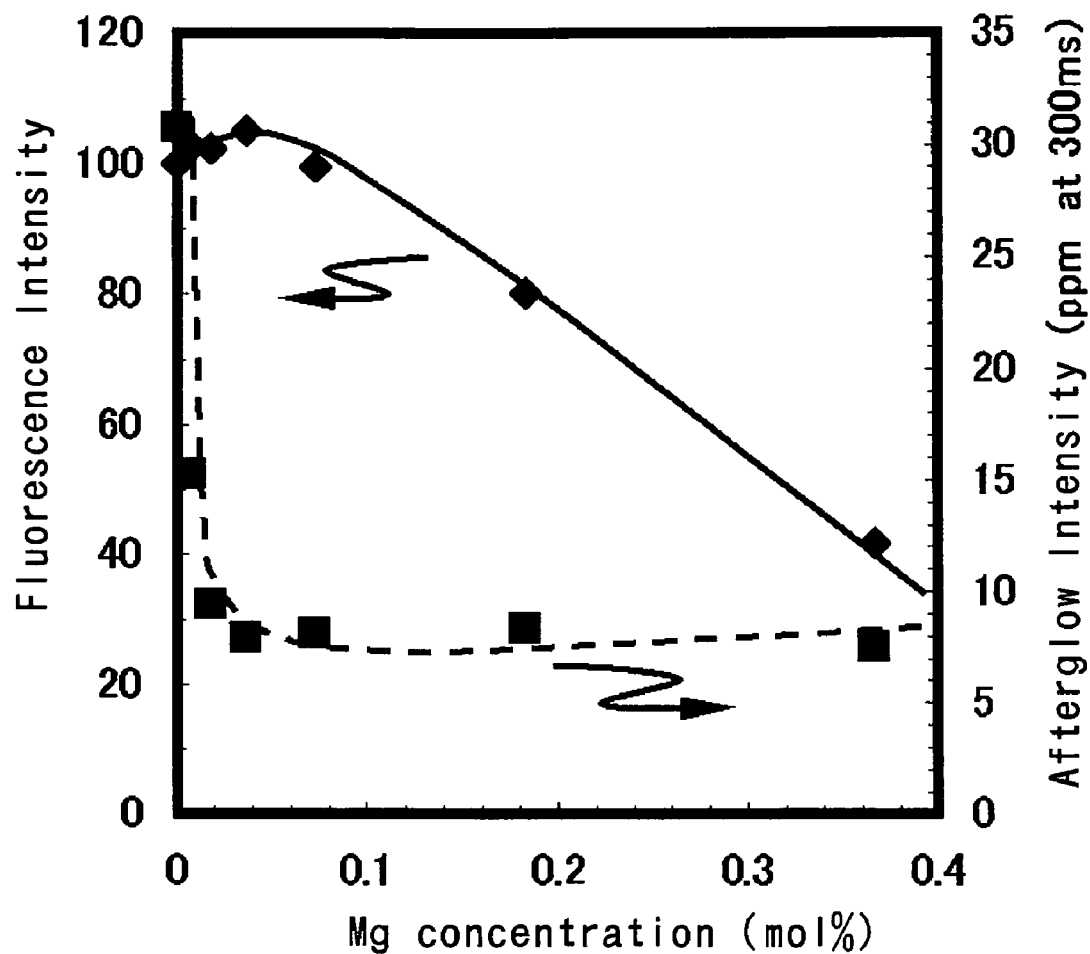

[Fig.9]
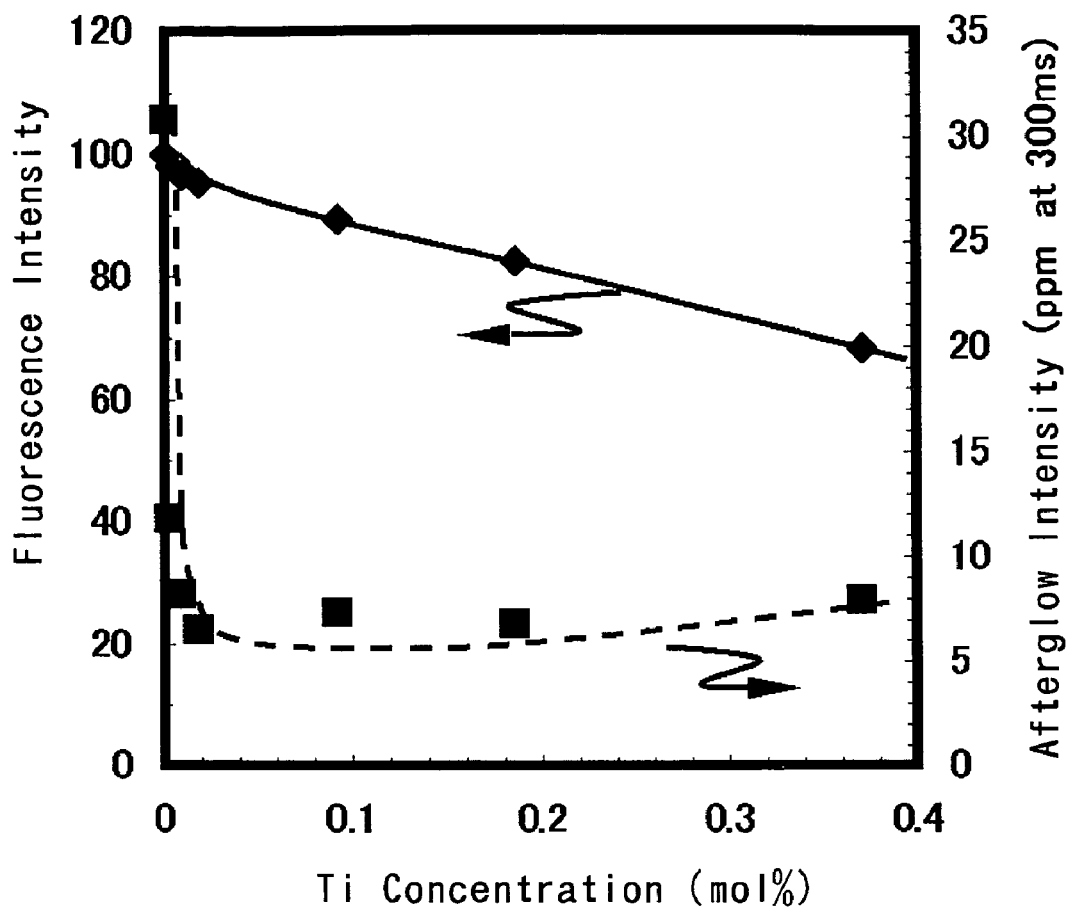

[Fig.10]
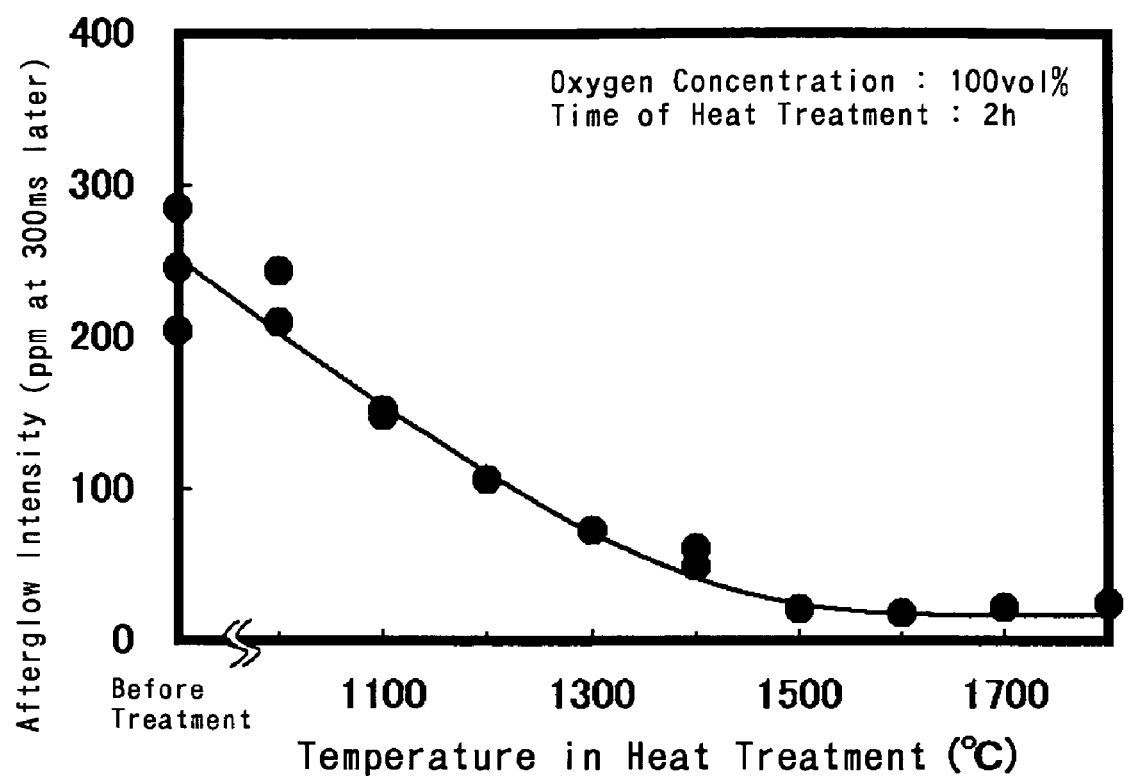

[Fig.11]
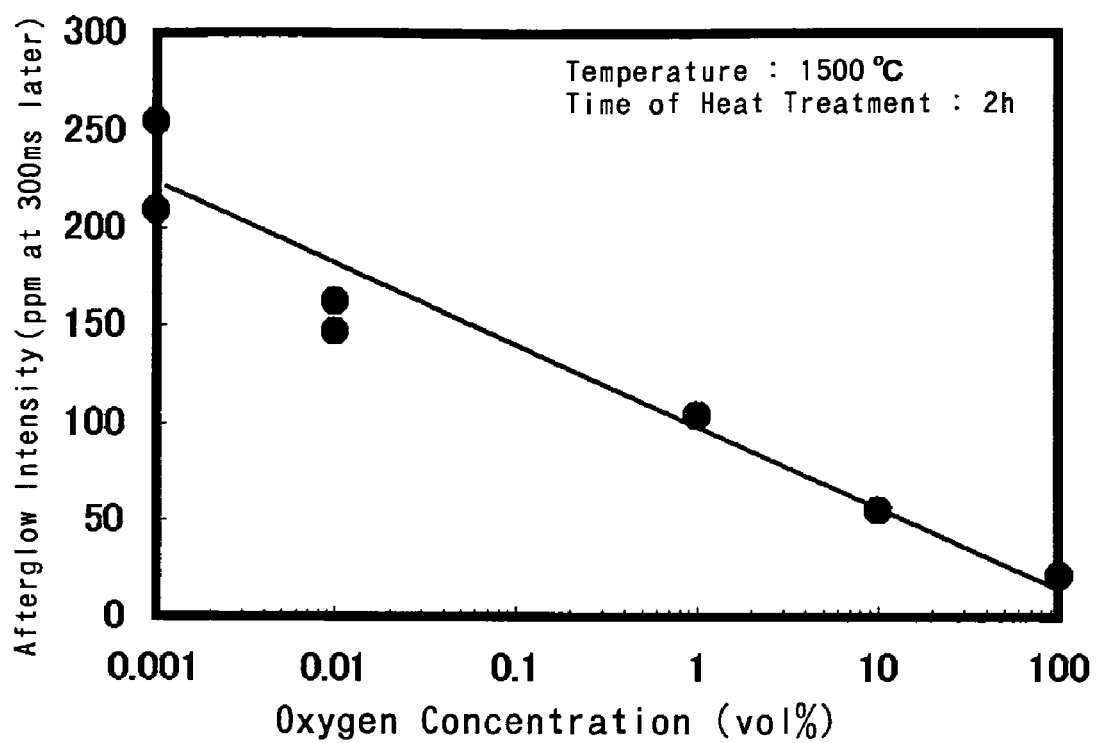

[Fig.12]
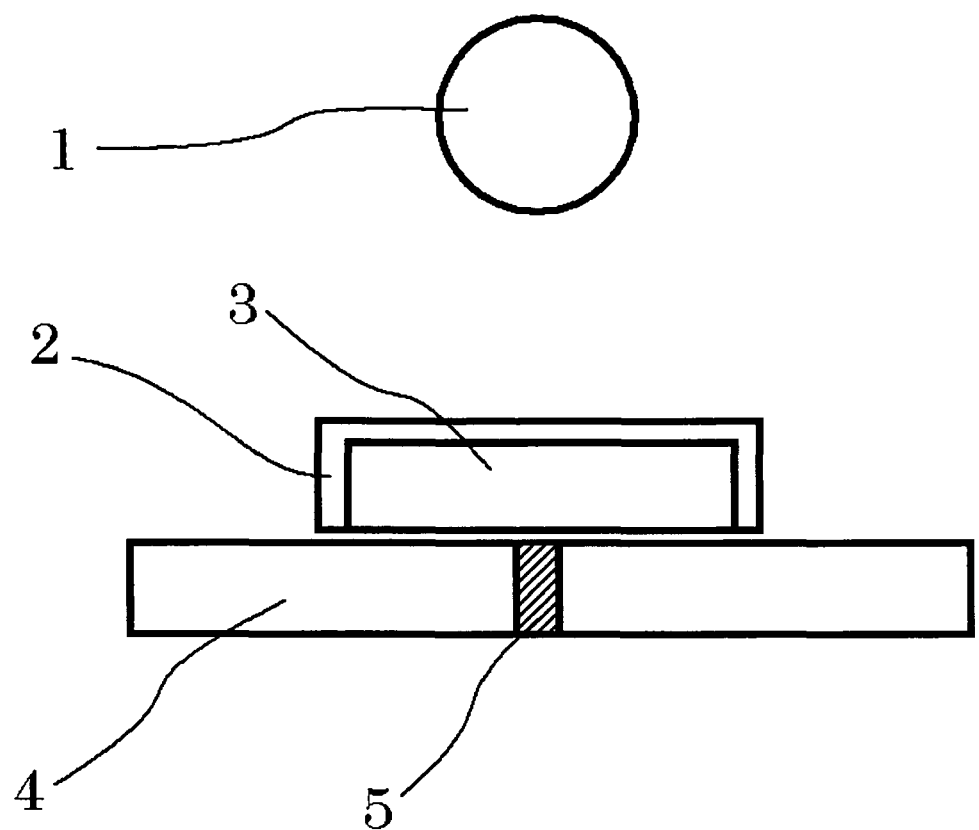

[Fig.13]
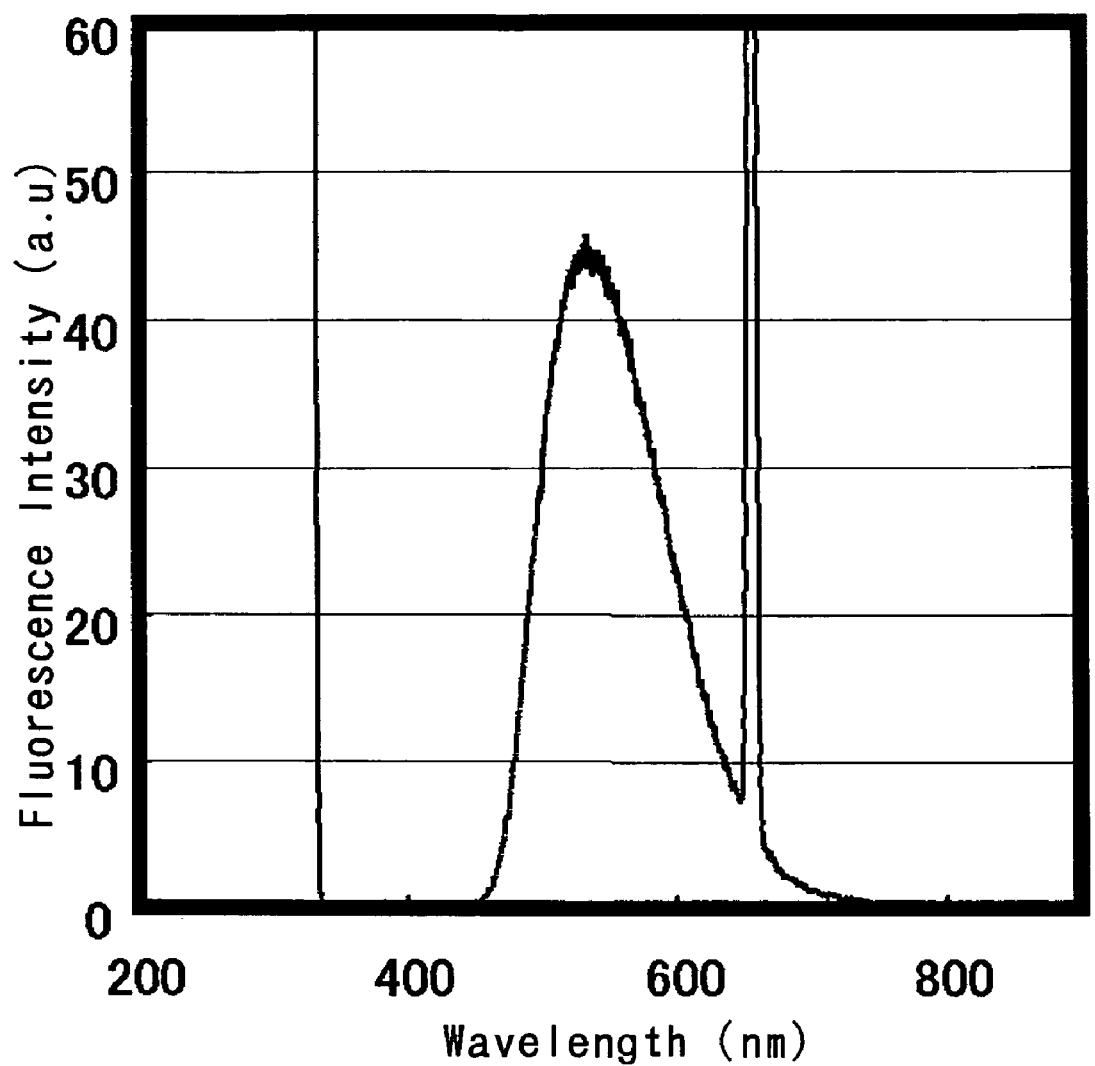

FLUORESCENT MATERIAL, A METHOD OF MANUFACTURING THE FLUORESCENT MATERIAL, A RADIATION DETECTOR USING THE FLUORESCENT MATERIAL, AND AN X-RAY CT SCANNER

CROSS-REFERENCE TO RELATED APPLICATION

This application is a continuation application of U.S. patent application Ser. No. 11/722,413, filed Jun. 21, 2007, now U.S. Pat. No. 7,595,492 which is a 371 of PCT/JP2005/023347, filed Dec. 20, 2005, the disclosures of which are incorporated herein by reference.

BACKGROUND OF THE INVENTION

1. Field of the Invention

This invention relates to a fluorescent material which absorbs radiation such as X-ray and emits light, to a radiation detector using it, and to an X-ray CT scanner.

2. Description of the Related Art

X-ray CT (Computed Tomography) scanner is known as one of the X ray diagnostic equipment. This CT scanner comprises an X-ray tube which emits a fan-beam (fan shaped beam) X-ray, and an X-ray detective system in which many X ray detectors were put side by side. This device emits a fan-beam X-ray from the X-ray tube towards the X-ray detective system. Each time it emits the X-ray, the angle to the tomographic layer is changed, for example, by 1 degree, and X-ray absorption data is collected. By analyzing this data by computer, the X-ray absorptance in the position of each tomographic layer, is computed. And a picture is formed according to this absorptance.

As this X-ray detector, a detector using Xenon (Xe) gas, has been used up to now. Xenon gas is sealed in a gas chamber in this detector. When high voltage is given between arranged electrodes, and the X-ray is emitted, the X-ray ionizes Xenon gas. The current signal according to the intensity of the X-ray can be taken, and the picture corresponding to it can be formed. However, in this detector, it is required to seal high-pressure Xenon gas in a gas chamber. Therefore, a thick window is needed.

Therefore, the detection efficiency of X-ray became low, and sensitivity became low. In order to obtain CT scanner with high resolution, it is necessary to make thickness of an electrode plate thin as much as possible. However, if an electrode plate is made thin, an electrode plate will vibrate and a noise is generated by vibration from the outside.

On the other hand, the detector both with scintillator using fluorescent materials, and with silicon photo diode, is developed and is already put in practical use. As the fluorescent material, such as, $CdWO_4$ single crystal, $(Y,Gd)_2O_3$:Eu, the ceramics composed of Pr and $Gd_2O_2S$:Pr, Ce, and F (GOS:Pr, called later), or polycrystal of oxide (GAGG:Ce, called later) with garnet structure composed mainly of gadolinium oxide, gallium oxide, and an aluminum oxide, and cerium oxide is used. In this detector, the scintillator absorbs X-ray and emits light. The X-ray is detected when a silicon photo diode detects this light. Here, the fluorescent material used as a scintillator emits light with the wavelength according to the energy level which is generated by the activator, doped to the host material. Since the detection efficiency of a silicon photo diode is high for the visible light with wavelength of 500 nm or longer, this detector can detect X-ray with high sensitivity. As a notation method of a fluorescent material, on both sides of ":", the host material was indicated on left-hand side, and activator was indicated on right-hand side among the chemical formula. In the detector using such materials, it is easy to miniaturize a detecting element and to increase the number of channels. Therefore, a picture with higher resolution than the detector using xenon gas, can be made. Generally, what is required for such a fluorescent material are, little variation in X-ray characteristics due to the high homogeneity of the material, little degradation against radiation damage, little variation in the fluorescent characteristics against variation in the environment such as temperature variation, being easy to manufacture, little degradation against the manufacturing process, and being chemically stable without hygroscopicity.

In such an X-ray detector, the sensitivity becomes high, as the intensity of light (fluorescence intensity) emitted from the scintillator after absorption of X-ray is high. In order to make fluorescence intensity high, it is necessary to fully absorb X-ray. If this absorption is a little, X-ray which penetrates the scintillator will increase and this X-ray will serve as a noise source in the silicon photo diode, therefore, S/N ratio decreases. In order to reduce the X-ray penetrating the scintillator, it is necessary to make the scintillator thick. However, the detecting element cannot be miniaturized in this case, but its cost increases. Therefore, in order to fully absorb X-ray with a thin fluorescent material, X-ray absorption coefficient must be large. On the other hand, if the transmittance of this light in the fluorescent material is low, the light which does not reach the photo-diode, among the generated lights, will increase, therefore, fluorescence intensity falls substantially. Therefore, in order to make fluorescence intensity high, it is required for the fluorescent material used as a scintillator material, that (1) the absorption coefficient of X-ray should be high, that (2) the transmittance of the generated light should be high.

And also high resolution is required of X-ray computed tomography. Therefore, the miniaturization of a detecting element is required. In order to lessen influence by a subject moving, it is required to shorten scanning time. In this case, the storage time in one detecting element becomes short, and the X-ray dose absorbed in the storage time decreases. Therefore, especially high fluorescent efficiency (high fluorescence intensity) is required. Furthermore, in order to improve the time resolution of a detecting element, fluorescence just after X ray irradiation stops (afterglow), should be low. For the purpose, both decay time constant of the fluorescence, and the afterglow intensity, should be low. Here, the decay time constant of luminescence means a time after stopping X-ray irradiation until the fluorescence intensity becomes 1/e of the fluorescence intensity during the X-ray irradiation. Afterglow intensity means a ratio of the fluorescence intensity after a constant time passed, since the X-ray irradiation stops, to the fluorescence intensity during the X-ray irradiation. If the intensity decays completely exponentially, small decay time constant leads to weak afterglow directly. However, actually, afterglow does not decay exponentially. Therefore, in order to get a high-performance X-ray CT scanner with weak afterglow, it is necessary to use a fluorescent material with both small decay time constant and weak afterglow intensity. The fluorescence intensity, the decay time constant, and the afterglow intensity in various fluorescent materials currently used conventionally, are shown in Table 1.

TABLE 1

| | Material | Crystal | Fluorescence Intensity | Decay Time Constant (μs) | Afterglow Intensity (%) at 30 ms |
|---|---|---|---|---|---|
| A | $CdWO_4$ | single | 100 | 5.0 | 0.002 |
| B | $Gd_2O_2S$: Pr,Ce,F | poly | 180 | 3.0 | 0.01 |
| C | $(Y,Gd)_2O_3$: Eu,Pr | poly | 180 | 1000 | 0.01 |
| D | $Gd_3Ga_5O_{12}$: Cr,Ce | poly | 130 | 140 | 0.01 |
| E | $Gd_3Al_3Ga_2O_{12}$: Ce | poly | 170 | ~0.5 | 0.01 |

Among the above materials, $Gd_3Al_3Ga_2O_{12}$:Ce (GGAG:Ce) emits light, by the allowed transition from 5d level to 4f level of $Ce^{3+}$, made by activator Ce. For example, in Japanese Patent No. 2001-4753 and in Japanese Patent No. 2003-119070, polycrystal material of GGAG:Ce is shown as a scintillator material with both high fluorescence intensity and weak afterglow.

However, for recent high-performance X-ray CT scanner, it is needed to get the tomographic image with higher resolution. Therefore, storage time for a single X ray detecting element becomes shorter. Therefore, for the scintillator used for the X ray detecting element, more strict level is needed on the fluorescence intensity and the afterglow. The characteristics of the polycrystal of above-mentioned GGAG:Ce did not fit this demand, either. Therefore, high-performance X-ray CT scanner could not be obtained, because no fluorescent material with both high fluorescence intensity and weak afterglow, was found.

This invention is made in view of this problem, and an object of this invention is to provide the invention which solves the above-mentioned problem.

SUMMARY OF THE INVENTION

An object of this invention is to solve the above subjects.

This invention is constructed as described below in order to solve the aforementioned problems.

An aspect in accordance with the present invention provides, a fluorescent material composed of single crystal with garnet structure, containing Gd, Al, Ga, and O at least, and also containing Ce as an activator, wherein atomic ratios of Gd, Ga, Al, and Ce are in the range of; Ga/(Gd+Ga+Al+Ce) is 0.2-0.3, Al/(Gd+Ga+Al+Ce) is 0.35-0.4, and Ce/(Gd+Ga+Al+Ce) is 0.0005-0.006.

Moreover, in the fluorescent material of the present invention, wherein said fluorescent material contains Zr with concentration of 0.0001-3 mass %.

Another aspect in accordance with the present invention provides, a fluorescent material with garnet structure containing Gd, Lu, Al, Ga, and O at least, and also containing Ce as an activator, wherein said fluorescent material is expressed as $Gd_{3-p-q}Lu_pCe_qAl_rGa_{5-r}O_{12}$, wherein $0.1 \leq p \leq 3.0$, $0.001 \leq q \leq 0.05$, and $2 \leq r \leq 4$.

Moreover, in the fluorescent material of the present invention, wherein said fluorescent material is composed of single crystal.

Moreover, in the fluorescent material of the present invention, wherein said fluorescent material is composed of polycrystal.

Moreover, in the fluorescent material of the present invention, wherein said fluorescent material is composed of single crystal or polycrystal, wherein $1.0 \leq p \leq 2.0$.

Another aspect in accordance with the present invention provides, a fluorescent material with garnet structure containing Gd, Al, Ga, and O at least, containing Lu and/or Y, and also containing Ce as an activator, wherein said fluorescent material is expressed as $(Gd_{1-x-z}L_xCe_z)_{3+a}(Al_{1-u}Ga_u)_{5-a}O_{12}$, wherein L is Lu and/or Y, wherein $0 < a \leq 0.15$, $0 < x < 1.0$, $0.0003 \leq z \leq 0.0167$ (here, x+z<1.0), and $0.2 \leq u \leq 0.6$.

Moreover, in the fluorescent material of the present invention, wherein said fluorescent material is composed of single crystal, wherein $0.032 < a \leq 0.15$.

Moreover, in the fluorescent material of the present invention, wherein said fluorescent material is composed of single crystal, wherein $0.0925 < x \leq 0.5$ (when Lu is L), $0.2 \leq x \leq 0.67$ (when Y is L), or $0.0925*v+0.2*(1-v) < x \leq 0.5*v+0.67*(1-v)$, here, a ratio of Lu to Y is set to v and $0 < v < 1$ (when both Lu and Y are contained in L).

Moreover, in the fluorescent material of the present invention, wherein said fluorescent material is composed of single crystal, wherein $0.032 < a \leq 0.15$, wherein $0.0925 < x \leq 0.5$ (when Lu is L), $0.2 \leq x \leq 0.67$ (when Y is L), or $0.0925*v+0.2*(1-v) < x \leq 0.5*v+0.67*(1-v)$, here, a ratio of Lu to Y is set to v and $0 < v < 1$ (when both Lu and Y are contained in L).

Moreover, in the fluorescent material of the present invention, wherein said fluorescent material is composed of polycrystal, wherein $0.032 < a \leq 0.15$.

Moreover, in the fluorescent material of the present invention, wherein said fluorescent material is composed of polycrystal, wherein $0.0925 < x \leq 0.5$ (when Lu is L), $0.2 \leq x \leq 0.67$ (when Y is L), or $0.0925*v+0.2*(1-v) < x \leq 0.5*v+0.67*(1-v)$, here, a ratio of Lu to Y is set to v and $0 < v < 1$ (when both Lu and Y are contained in L).

Moreover, in the fluorescent material of the present invention, wherein said fluorescent material is composed of polycrystal, wherein $0.032 < a \leq 0.15$, wherein $0.0925 < x \leq 0.5$ (when Lu is L), $0.2 \leq x \leq 0.67$ (when Y is L), or $0.0925*v+0.2*(1-v) < x \leq 0.5*v+0.67*(1-v)$, here, a ratio of Lu to Y is set to v and $0 < v < 1$ (when both Lu and Y are contained in L).

Moreover, in the fluorescent material of the present invention, wherein scandium (Sc) is doped, and doping concentration of Sc is 0.004-10 mol %.

Moreover, in the fluorescent material of the present invention, wherein one or more species among magnesium (Mg), Nickel (Ni), and titanium (Ti), are doped at concentration of 0.003-0.2 mol %.

Moreover, in the fluorescent material of the present invention, wherein transmission of light at wavelength of 550 nm is 60% or higher.

Another aspect in accordance with the present invention provides, a manufacturing method of a fluorescent material by which said fluorescent material is grown from liquid phase, wherein said fluorescent material is composed of single crystal with garnet structure containing Gd, Al, Ga, and O at least, and also containing Ce as an activator, wherein atomic ratio of Gd, Ga, Al, and Ce is in the range of; Ga/(Gd+Ga+Al+Ce) is 0.2-0.3, Al/(Gd+Ga+Al+Ce) is 0.35-0.4, Ce/(Gd+Ga+Al+Ce) is 0.0005-0.006, wherein atmosphere during said growth is composed of a gas with mixture of oxygen and inactive gas.

Moreover, in the manufacturing method of a fluorescent material of the present invention, wherein oxygen concentration of said atmosphere is 0.01-50 vol %.

Moreover, in the manufacturing method of a fluorescent material of the present invention, wherein composition ratio of Al to Ga in raw materials is set to $(1-k*u):(k*u)$, wherein after manufacturing, ceramics with k=1.005-1.3, said fluorescent material is given by CZ (Czochralski) method or FZ (Floating Zone) method, in which said ceramics are heated and molten.

Another aspect in accordance with the present invention provides, a manufacturing method of the fluorescent material of the present invention, wherein heat treatment at temperature of 1100-1800 degrees C in atmosphere containing oxygen, is carried to said fluorescent material which is composed of single crystal or polycrystal.

Moreover, in the manufacturing method of a fluorescent material of the present invention, wherein oxygen concentration in said atmosphere is equal or higher than 0.01 vol %.

Another aspect in accordance with the present invention provides, a radiation detector comprising scintillator which absorbs radiation and emits light, and photodetector which detects said emitted light, wherein said scintillator is made of the fluorescent material of this invention.

Moreover, in the radiation detector of the present invention, wherein thickness of said fluorescent material is 0.5-10 mm.

Another aspect in accordance with the present invention provides, an X-ray CT scanner comprising X-ray source which emits X-ray, and an X-ray detector which faces said X-ray source, wherein radiation detector of this invention is used as said X-ray detector.

According to the fluorescent material of this invention, scintillator with both high fluorescence intensity and weak afterglow, can be offered. And with this fluorescent material, a radiation detector, or a X-ray CT scanner of this invention has high sensitivity. And miniaturization of the detecting element can be achieved. Shortening of scanning time can be also achieved, that leads to improvement in resolution. Also stable detecting performance can be obtained.

BRIEF DESCRIPTION OF THE DRAWINGS

FIG. 1 shows the dependence of absorption coefficient in a fluorescent material of a 2nd embodiment on energy of X-ray.

FIG. 2 shows the dependence of X-ray transmission of a fluorescent material of a 2nd embodiment at sample thickness of 3 mm on energy of X-ray.

FIG. 3 shows the dependence of fluorescence intensity and afterglow intensity of a fluorescent material of a 3rd embodiment on "a".

FIG. 4 shows the dependence of relative fluorescence intensity and yield of grown single crystal of a fluorescent material of a 3rd embodiment on "a".

FIG. 5 shows the dependence of fluorescence intensity of a fluorescent material of a 3rd embodiment, in which Lu is doped, on x.

FIG. 6 shows the dependence of fluorescence intensity of a fluorescent material of a 3rd embodiment, in which Y is doped, on x.

FIG. 7 shows the dependence of fluorescence intensity and afterglow intensity of a fluorescent material of a 3rd embodiment on Sc concentration.

FIG. 8 shows the dependence of fluorescence intensity and afterglow intensity of a fluorescent material of a 3rd embodiment on Mg concentration.

FIG. 9 shows the dependence of fluorescence intensity and afterglow intensity of a fluorescent material of a 3 rd embodiment on Ti concentration.

FIG. 10 shows the dependence of afterglow intensity on the temperature of the heat treatment in a manufacturing method of the fluorescent material of a 3rd embodiment.

FIG. 11 shows the dependence of afterglow intensity on the oxygen concentration in the atmosphere of the heat treatment in a manufacturing method of the fluorescent material of a 3rd embodiment.

FIG. 12 shows the outline of a apparatus by which the fluorescence intensity by emitted X-ray, was measured.

FIG. 13 shows the emission spectrum of a fluorescent material of example 1, excited by light at wavelength of 330 nm.

DETAILED DESCRIPTION OF THE PREFERRED EMBODIMENTS

A fluorescent material, a method of manufacturing the fluorescent material of this invention, a radiation detector, and a X-ray CT scanner, are explained in detail. However, these are not limited to the following embodiment.

A 1st Embodiment

A fluorescent material concerning a 1st embodiment has weak afterglow, and it has high fluorescence intensity by making especially optical transmittance high. This fluorescent material contains cerium (Ce) as an activator. It is a fluorescent material with the garnet structure which contained gadolinium (Gd), aluminum (aluminum), gallium (Ga), and oxygen (O) at least. With atomic number ratios, Ga/(Gd+Ga+Al+Ce) is 0.2-0.3, Al/(Gd+Ga+Al+Ce) is 0.35-0.4, and Ce/(Gd+Ga+Al+Ce) is 0.0005-0.006. And the fluorescent material is single crystal. If composition of Gd, Ga, and Al which constitute a host material is outside of said range, sufficient fluorescence intensity cannot be obtained. Deviation from the stoichiometric composition of the garnet structure $(Gd_{1-z}Ce_z)_3(Al_{1-u}Ga_u)_5O_{12}$, makes defect levels due to nonstoichiometric defect. It is supposed that this defect levels serve as energy levels in phonon transition without luminescence. On the other hand, when the concentration of Ce which is an activator, is outside the above-mentioned range, sufficient fluorescence intensity cannot be obtained. This is based on the following causes. When Ce ratio is less than 0.0005, since there are too few Ce atoms, energy of the absorbed x-ray is not efficiently convertible for light energy. When Ce ratio exceeds 0.006, the distance between Ce atoms becomes small too much. For this reason, it is supposed that the phenomenon what is called of quenching without luminescence has occurred. More preferably for efficient luminescence, Ga/(Gd+Ga+Al+Ce) is 0.24-0.27, Al/(Gd+Ga+Al+Ce) is 0.37-0.39, and Ce/(Gd+Ga+Al+Ce) is 0.001-0.002.

This fluorescent material is single crystal manufactured using a liquid phase method. Here, single crystal means not only the materials in perfect single crystal state, but the material in the imperfect crystal state obtained by the usual liquid phase method. Since it is not fabricated by the powder metallurgical method, few or no grain boundary exist. Therefore, each adjoining crystal grain tend to have the same crystal orientation. Therefore, stress and distortion in the crystal decrease extremely. Therefore, inhomogeneity is hard to be generated in fluorescence by Ce. Essential fluorescent characteristic by Ce can be given. Generation of the defect level formed by distortion of the grain boundaries is also suppressed. Therefore, it is inhibited that electrons are trapped by this energy level. Therefore, afterglow can be made very weak. As mentioned above, the fluorescent material emits light by $Ce^{3+}$ from 5d to 4f transition. Therefore, a decay time constant is very short, as tens to 100 nanoseconds. Furthermore, since there is an effect which makes an afterglow weak by removing this grain boundary, a detecting element with very fast response, is attained. Furthermore, Ce existing near a grain boundary will be in the tetravalent state, which do not contribute to fluorescence by the above-mentioned distortion etc. easily, and will cause the decrease of the fluorescent output. However, most of contained Ce can be made to trivalent ions, by making the material to single crystal state or the state like that. Therefore, a fluorescent output can be heightened sharply.

In this fluorescent material, the transmittance of light at wavelength of 550 nm is 60% or higher. The transmittance in this invention is the transmittance at 3 mm in thickness. It is a value in the state in which both faces were polished. The wavelength of 550 nm is equivalent to the center wavelength of the light emitted by transition from 5d to 4f level of $Ce^{3+}$ ion. The transmittance in this invention shows the value of the transmittance measured with the commercial spectrophotometer which does not use an integrating sphere. This transmittance shows the rate of the incident component reduced by sum of the reflective component in the entrance plane and exit plane, absorbed component in the material during propagation, and scattered component not reaching the detector scattered by the scatterer, to the incident component. This transmittance is determined by amount of scatterer when the quality of the material is the same. When there is much scatterer, an optical path changes by scatterer and the light spreads the inside of a crystal repeatedly. Between them, this light is absorbed by the material which exists near the crystal, and by the crystal. Therefore, effective fluorescence characteristics becomes low, and it is preferred that the value of this transmittance is large. In the fluorescent material of this embodiment, the number of these scatterers is reduced by setting this material single crystal. Therefore, transmittance can be made into 60% or higher, that is 1.2 times or higher of the conventional GGAG polycrystal material or $Gd_2O_2S$ material, by using this fluorescent material with single crystal phase. Therefore, the radiation detector with high sensitivity can be constituted. For example, even if compared with the case shown in Japanese Patent No. 2003-119070, which indicate the transmittance of 1.8-mm-thick GGAG polycrystal, the transmittance can be improved greatly. As transmittance is lower than 60%, the emitted light becomes hard to be detected, so effective fluorescent characteristic gets worse greatly.

As for said fluorescent material, it is preferred to contain Zr by the concentration of 0.0001-3 mass %. Because this fluorescent material emits light by transition from 5d to 4f by $Ce^{3+}$ ion, if the amount of $Ce^{4+}$ ion which does not contribute to fluorescence increases, fluorescence intensity will be decreased. By doping a dopant with stably tetravalent state, change of Ce from trivalent state to tetravalent state, can be inhibited. Therefore, high fluorescence intensity can be obtained. Especially Zr has stable tetravalent state, and by doping Zr, change of Ce to tetravalent state, can be inhibited effectively. If the amount of Zr is less than 0.0001 mass %, the above mentioned effect is not fully demonstrated. On the other hand, if the amount of Zr exceeds 3 mass %, as compared with contained Ce, the amount of Zr will increase too much, and fluorescence intensity will be decreased greatly. In order to fully get the effect of Zr doping, the amount of Zr may be 0.001 to 0.5 mass % more preferably. Another dopant with stably tetravalent state similarly, such as Hf, Si, Ge, or Ti, may be doped, in addition to Zr, or instead of Zr.

Since this fluorescent material is manufactured by a liquid phase method, Ir, Pt etc. may be easily mixed from a crucible etc. while melting the raw materials. If these elements were mixed so much, fluorescence characteristics, such as fluorescence intensity, will deteriorate. Therefore, as for the amount of these elements, it is preferred that it is below 1 mass %.

This fluorescent material is manufactured by a liquid phase method. For example, $Gd_2O_3$, $Al_2O_3$, $Ga_2O_3$, or cerium salts such as cerium nitrate, may be used as raw materials. In order to manufacture high quality single crystal materials, it is preferred that the materials before being in liquid phase state, is in the state with garnet structure. Therefore, after weighing out each of the above-mentioned raw materials to a proper quantity, and mixing them using a ball mill etc., the mixed powder may be put into a crucible and a calcination may be performed at the temperature of 1000 to 1700 degrees C. for several hours. In order to inhibit mixing of the impurity which cause a bad influence on fluorescent characteristics and to obtain a high quality fluorescence material, it is preferred that the above mentioned crucible may be made from alumina. Moreover, although the above mentioned oxides etc. are preferable as the raw materials, other materials may be used instead, if the GGAG:Ce single crystal can be also manufactured similarly. The purity of the raw material is preferred to be 99.99% or higher, and to be 99.999% or higher more preferably.

As the growth method, any liquid phase method may be used. Resistance heating, radio-frequency heating, or condensing heating may be used as the heating method. Crystal pulling method, crystal pulling down method, or liquid phase method may be used as the crystal growth. However, because melting points of the material is high, and because the crystal with wide area is needed, Czochralski method (CZ method) is most suitable. On the other hand, to inhibit mixing of impurities, the floating zone method (FZ method) is excellent. Since the melting point of this material is as high as 1700 degrees C. or higher, the crucible may be made of Ir etc., for CZ method etc. Moreover, the inventors found that Ce is easily segregated in this fluorescence material. Therefore, it is preferred to supply the raw material of the same component as the growth crystal during the growth, to keep the composition of the melt.

As atmospheric gas during the crystal growth, rare gas, such as argon or helium, mixed gas of inactivity gas like nitrogen with oxygen, may be used. Oxygen in this atmosphere may inhibit evaporation of Ga in the melt, and high fluorescence intensity can be obtained by the oxygen. In order to suppress variation of the melt composition and crystal composition during the growth, the oxygen concentration in the atmosphere is preferred to be set beyond 0.01 vol %. Oxygen concentration may be 1% or more preferably, and 4% or more, more preferably. Moreover, as for the oxygen concentration of the atmosphere, also in order to obtain high fluorescence intensity, it is preferred that the concentration is 1% or more, and it is still more desirable that the concentration is 4% or more. In manufacturing the GGAG ceramics of polycrystal using the atmospheric pressure sintering method as shown in Japanese Patent No. 2003-119070, in order to obtain high-density ceramics, it is necessary to make the oxygen concentration high. However, in order to obtain a single crystal by a liquid phase method here, high oxygen concentration is not necessarily needed. Therefore, by keeping the oxygen concentration in the atmosphere to less than 50 vol %, generation of $Ce^{4+}$ can be inhibited, and fluorescent intensity may be increased. In addition, when applying the CZ method as a liquid phase method and using iridium as crucible material, the reaction of iridium with oxygen in the atmosphere arises. Therefore, in this case, the oxygen concentration may be less than 10 vol % preferably, and may be 5 vol % or less more preferably.

Also another heat treatment (annealing process) under oxygen existence may be given again to this single crystal fluorescence material obtained by the liquid phase method. This annealing process is effective especially on the single crystal of the fluorescent material grown in atmosphere with low oxygen concentration. Setting the oxygen concentration in the single crystal growth atmosphere low, for example, less than 10 vol %, or especially less than 4 vol %, the afterglow may be increased probably due to oxygen defects. However, then afterglow can be decreased by giving the above-mentioned annealing process. To get the effect on the high fluorescence intensity, the oxygen concentration in this annealing process, may be higher than that in the crystal growth preferably. This oxygen concentration may be 10-100 vol % preferably, or may be 20-100 vol % more preferably. Moreover, as for the temperature in the annealing process, 1000-1700 degrees C. is preferred. If the temperature is lower than 1000 degrees C., the effect by the annealing is not fully acquired. If this temperature exceeds 1700 degrees C., since it will become close to a melting point, the composition may be changed. This temperature may be 1300-1600 degrees C more preferably. The annealing time is suitably determined by the size of a single crystal etc.

And rapid cooling during the growth causes high supersaturation state, in this case, different phase, such as alumina or perovskite type crystal, may be generated, and high quality GGAG single crystal is not obtained. In this case, fluorescence intensity decreases and transmittance decreases. Therefore, cooling rate may be below 20 degrees C./min preferably. In order to grow the crystal stably, it is desirable to use a seed crystal. The shape of the seed crystal may be arbitrary. However, in order to make handling easy, cylindrical shape with diameter of several millimeters, or rectangular parallelepiped shape with several millimeter square, is preferred.

A 2nd Embodiment

In a fluorescent material concerning a 2nd embodiment, afterglow is weak and the fluorescence intensity is raised by raising X-ray absorption coefficient. This material is a fluorescent material with garnet structure containing cerium (Ce) as the activator, and also containing gadolinium (Gd), lutetium (Lu), aluminum (aluminum), gallium (Ga), and oxygen (O) at least, and its general formula is expressed with $Gd_{3-p-q}Lu_pCe_qAl_rGa_{5-r}O_{12}$, here, $00.1 \leq p \leq 3.0$, $0.001 \leq q \leq 0.05$, and $2 \leq r \leq 4$. In the garnet structure shown in (Gd, Lu, Ce) 3 $(Al, Ga)_5O_{12}$, as deviation from stoichiometry becomes large, on composition of Gd, Lu, Ga, and Al, which constitute a host material, fluorescence intensity will be decreased. Because nonstoichiometric defects will be generated in the crystal and the defect will work as a center of electron transition without fluorescence in this case. High fluorescence intensity cannot be obtained, when the composition of Ce, which is an activator, is out of above mentioned range of q. Because, since there are too few Ce atoms when q is less than 0.001, energy of the absorbed X-ray is not efficiently converted to light. Since the distance between Ce atoms becomes small too much when q exceeds 0.05, quenching will occur without fluorescence. About composition of Al and Ga, fluorescence intensity is large in $2 \leq r \leq 4$, and the intensity will be maximum when r=3. Compositions of Gd and Lu is determined by the absorption coefficient and by the transmittance of X-ray. The relation between the energy of X-ray and an absorption coefficient is shown in FIG. 1. The relation between the energy of X-ray and the transmittance with sample thickness of 3 mm, is shown in FIG. 2. As shown in these figures, in the composition without Lu, the absorption coefficient is small in 80 keV and beyond, on X-ray energy. In the composition containing Lu, the absorption coefficient becomes large as the amount of Lu increase, in 80 KeV and beyond. However, near the K absorption edge (61.1 KeV) of Lu, the absorption coefficient decreases conversely. However, as the spectrum is shown in FIG. 1 and FIG. 2, X-ray used in an X-ray CT scanner mainly, has the energy of 60 keV or higher. Therefore, the material containing Lu can absorb X-ray effectively. Therefore, fluorescence intensity is high in $00.1 \leq p \leq 3.0$ as composition of Gd and Lu. Fluorescence intensity becomes especially large in $1.0 \leq p \leq 2.0$. In Table 2, density, absorption coefficient, fluorescence intensity, decay time constant, and afterglow intensity in the fluorescent material of this embodiment are compared with those in the conventional fluorescent material. Here, the value of fluorescence intensity means a relative value when setting that of $CdWO_4$ single crystal to 100. And the value of afterglow intensity means a ratio (%) of the fluorescence intensity after 30 ms since X-ray irradiation stops, to the fluorescence intensity during the X-ray irradiation. Here, sample A to E are conventional fluorescent materials and sample F to I are fluorescent materials of this embodiment. Each of sample F and G is single crystal (F) and polycrystal (G) with same composition (p=1, q=0.01, r=3). Each of sample H and I is single crystal (H) and polycrystal (I) with same composition (p=2, q=0.01, r=3). And sample E has composition (p=0, q=0.01, r=3), where Lu in the fluorescent material of this embodiment, is not contained. In the fluorescent material of this embodiment, the absorption coefficient in the range of 80 keV and beyond becomes large by Lu addition as aforementioned, and fluorescence intensity is also high. In sample A-D which are conventional ones, there are some samples with almost equivalent fluorescence intensity as the fluorescent material of this embodiment, and also with low afterglow intensity. However, since all have the large decay time constant, the afterglow characteristic is not sufficient. Each fluorescent material of this embodiment has high fluorescence intensity, and a decay time constant is 0.5 microsecond, and afterglow intensity is also as small as 0.01%.

This fluorescent material comprises single crystal material or polycrystal material. In single crystal material, since the lights generated are not scattered in the material because there is no grain boundary, as well as the fluorescent material of the 1st embodiment, and high fluorescence intensity can be easily obtained, single crystal is preferable the most. The fluorescent material with the garnet structure of this invention is a cubic crystal, and there is no crystalline anisotropy theoretically. Therefore, even if it is polycrystal, the light scattering in grain boundary is a little. Therefore, this fluorescent material may be polycrystal. However, in actual polycrystal materials, scattering of light arises by disorder of the crystal structure and by the deposition on the polycrystal particle surface, therefore, as shown in Table 1, fluorescence intensity decreases, compared with single crystal material with same composition. However, especially in $1.0 \leq p \leq 2.0$, fluorescence intensity is high, for example, therefore, polycrystal materials with this composition can also be used.

TABLE 2

| Material | | Crystal | Density (g/cm$^3$) | Absorption Coefficient(cm$^{-1}$) | | | Fluorescence Intensity | Decay Time (μs) | Afterglow Intensity (%)at 30 ms |
|---|---|---|---|---|---|---|---|---|---|
| | | | | (60 KeV) | (80 KeV) | (100 KeV) | | | |
| A | CdWO$_4$ | single | 7.99 | 28.8 | 36.7 | 22.1 | 100 | 5.0 | 0.002 |
| B | Gd$_2$O$_2$S: Pr,Ce,F | poly | 7.28 | 63.8 | 32.7 | 19.0 | 180 | 3.0 | 0.01 |
| C | (Y,Gd)$_2$O$_3$: Eu,Pr | poly | 5.92 | 33.1 | 16.8 | 9.5 | 180 | 1000 | 0.01 |
| D | Gd$_3$Ga$_5$O$_{12}$: Cr,Ce | poly | 7.09 | 39.6 | 20.3 | 11.8 | 130 | 140 | 0.01 |
| E | Gd$_3$Al$_3$Ga$_2$O$_{12}$: Ce | poly | 6.46 | 38.6 | 19.8 | 11.6 | 170 | ~0.5 | 0.01 |
| F | Gd$_2$LuAl$_3$Ga$_2$O$_{12}$: Ce | single | 6.76 | 31.2 | 22.7 | 13.5 | 230 | ~0.5 | 0.01 |
| G | Gd$_2$LuAl$_3$Ga$_2$O$_{12}$: Ce | poly | 6.76 | 31.2 | 22.7 | 13.5 | 190 | ~0.5 | 0.01 |
| H | GdLu$_2$Al$_3$Ga$_2$O$_{12}$: Ce | single | 7.07 | 23.4 | 25.7 | 15.5 | 220 | ~0.5 | 0.01 |
| I | GdLu$_2$Al$_3$Ga$_2$O$_{12}$: Ce | poly | 7.07 | 23.4 | 25.7 | 15.5 | 180 | ~0.5 | 0.01 |

* Measured by PIN photo diode

This single crystal material is manufactured by liquid phase method as the fluorescent material of the 1st embodiment. For example, Gd$_2$O$_3$, Lu$_2$O$_3$, Al$_2$O$_3$, Ga$_2$O$_3$, and cerium salt such as cerium nitrate, may be used as raw materials. In order to manufacture high quality single crystal materials, it is preferred that the materials before being in liquid phase state, is in the state with garnet structure. Therefore, after weighing out each of the above-mentioned raw materials to a proper quantity, and mixing them using a ball mill etc., the mixed powder may be put into a crucible and a calcination may be performed at the temperature of 1000 to 1700 degrees C. for several hours. In order to inhibit mixing of the impurity which cause a bad influence on fluorescent characteristics and to obtain a high quality fluorescence material, it is preferred that the above mentioned crucible may be made from alumina. Moreover, although the abovementioned oxides etc. are preferable as the raw materials, other materials may be used instead, if the GGAG:Ce single crystal can be also manufactured similarly. The purity of the raw material is preferred to be 99.99% or higher, and to be 99.999% or higher more preferably.

As the growth method, any liquid phase method may be used. Resistance heating, radio-frequency heating, or condensing heating may be used as the heating method. Crystal pulling method, crystal pulling down method, or liquid phase method may be used as the crystal growth. However, because melting points of the material is high, and the crystal with wide area is needed, Czochralski method (CZ method) is most suitable. On the other hand, to inhibit mixing of impurities, floating zone method (FZ method) is excellent. Since the melting point of this material is as high as 1700 degrees C. or higher, the crucible may be made of Ir etc., for CZ method etc. Moreover, the inventors found that Ce is easily segregated in this fluorescence material. Therefore, it is preferred to supply the raw material of the same component as the growth crystal during the growth, to keep the composition of the melt. As atmospheric gas during the crystal growth, rare gas, such as argon or helium, mixed gas of inactivity gas like nitrogen with oxygen, may be used. The inventors found that oxygen in this atmosphere may inhibit evaporation of Ga in the melt. In order to suppress variation of the melt composition and crystal composition during the growth, the oxygen concentration in the atmosphere is preferred to be set beyond 0.01 vol %. Oxygen concentration may be 1% or more preferably, and 3% or more, more preferably. In addition, when applying CZ method as a liquid phase method and using iridium as crucible material, the reaction of iridium with oxygen in the atmosphere arises. Therefore, in this case, the oxygen concentration may be less than 5 vol % preferably. And rapid cooling during the growth causes high supersaturation state, in this case, different phase, such as alumina or perovskite type crystal, may be generated. Therefore, high quality GGAG single crystal is not obtained. In this case, fluorescence intensity decreases and transmittance decreases. Therefore, cooling rate may be below 20 degrees C./min preferably. In order to grow the crystal stably, it is desirable to use a seed crystal. The shape of the seed crystal may be arbitrary. However, in order to make handling easy, cylindrical shape with diameter of several millimeters, or rectangular parallelepiped shape with several millimeter square, is preferred.

On the other hand, this polycrystal material is manufactured as ceramics using hot press or hot isostatic press (HIP) method. As manufacturing the calcination powder for single crystal material, after weighing out Gd$_2$O$_3$, Lu$_2$O$_3$, Al$_2$O$_3$, Ga$_2$O$_3$, and cerium salt such as cerium nitrate respectively, and mixing them using a ball mill etc., the mixed powder may be put into a crucible made of alumina, and calcination may be performed at the temperature of 1200 to 1500 degrees C. for several hours. In the case of hot press method, after the calcination, press molding may be done to get formed object using a die, after granulating the powder using a sieve with suitable aperture. Then, this formed object is set to carbon die, and hot press sintering is performed in inert gas atmosphere at temperature of 1500 to 1700 degrees C., and at pressure of 10 MPa to 80 MPa. In addition, if oxygen does not exist in the atmosphere during the sintering, gallium component may be easily separated. Therefore, it is desirable to arrange the powder of oxides, such as alumina, around the formed object of GAGG and to sinter that. On the other hand, in the case of the HIP method, calcination powder is grounded using ball mill etc., and press molding may be done to get formed object using a die. The obtained formed object may be densified by cold isostatic press (CIP) method, and may be put into a sagger made of alimuna, and calcination may be carried at temperature of 1500 to 1700 degrees C., in inactive gas atmosphere. HIP sintering is further performed to the obtained ceramics at pressure of 50 MPa or higher, and at temperature of 1300 to 1700 degrees C.

A 3rd Embodiment

A fluorescent material of 3rd embodiment has both high fluorescence intensity and weak afterglow. This material is a fluorescent material with garnet structure containing cerium (Ce) as the activator, and also containing gadolinium (Gd), aluminum (Al), gallium (Ga), and oxygen (O), and lutetium (Lu) or yttrium (Y). And its general formula is expressed with (Gd$_{1-x-z}$L$_x$Ce$_z$)$_{3+a}$(Al$_{1-u}$Ga$_u$)$_{5-a}$O$_{12}$, here, L is Lu or/and Y, $0 < a \leq 0.15$, $0 < x < 1.0$, $0.0003 \leq z \leq 0.0167$ (here, x+z<1.0), $0.2 \leq u \leq 0.6$. This fluorescent material is characterized by setting the composition shifted the composition in garnet structure from stoichiometry (a=0) including Lu or/and Y. Here, the element (Gd, L, Ce) located at C site (eightfold coordination) is in excess of stoichiometry, as 0<a. And the element (Al, Ga) located at A site (sixfold coordination) and D site (fourfold coordination), is decreased instead. The fluorescent material of the 2nd embodiment mentioned above corresponds to the case where a=0 in the above-mentioned formula. Even in this case, decay time constant is small enough and the decay time constant is equivalent also in this embodiment. Therefore, henceforth, only afterglow intensity is investigated to analyze the afterglow, unless indicated especially. This fluorescent material may be single crystal or polycrystal.

In addition to the energy levels formed by $Ce^{3+}$, which make fluorescence, other energy levels to which electron transition is possible is also formed in forbidden band, and the transition through the other energy levels may cause afterglow. Such energy levels will be formed if vacancy is formed at C site (eightfold coordination), and the vacancy is hard to be formed by setting 0<a. Therefore, afterglow intensity can be made weak while making fluorescence intensity high. On the other hand, if "a" becomes large, $GdAlO_3$ etc., with perovskite phase (different phase) from garnet structure, may be easily generated in this fluorescent material. This layer hardly contributes to fluorescence, and has refractive index different from the host material with garnet structure. Therefore, light scattering arises in the perovskite structure and the transmittance of the emitted light becomes low, therefore, fluorescence intensity of this fluorescent material is made low. If perovskite phase is formed, as this phase has different thermal expansion coefficient from the host material with garnet structure, crack may be easily generated. FIG. 3 shows the dependence of the fluorescence intensity and afterglow intensity on "a", when L=Lu, x=0.1, Z=0.0026, and u=0.41. Here, relative fluorescence intensity means ratio (%) of the fluorescence intensity to the maximum fluorescence intensity (in this case, fluorescence intensity when a=0). When a=0, fluorescence intensity is high, but afterglow intensity is also high. When a>0, afterglow intensity becomes low rapidly because of the above-mentioned reason. On the other hand, fluorescence intensity decreases gradually with increase in "a", and, when a=0.15, relative fluorescence intensity becomes 80% to that when a=0, Since perovskite phase will be generated if "a" becomes larger than 0.15, relative fluorescence intensity decreases further and crack may be generated easily. Therefore, if the allowable minimum of relative fluorescence intensity is set to 80%, the maximum value of "a", making fluorescence intensity high and also making afterglow intensity low, is 0.15. When "a" becomes larger than 0.15, although afterglow intensity becomes low, relative fluorescence intensity becomes lower than 80%. In addition, crack may be generated easily.

"z" determines composition of Ce which is an activator, and fluorescence intensity becomes large especially when $0.0003 \leq z \leq 0.0167$. When "z" is less than 0.003, since there are too few Ce atoms that work as an activator, absorbed X-ray energy cannot be converted efficiently to emitted light energy. When "z" is larger than 0.0167, since the distance between Ce atoms becomes too small, the phenomenon called quenching without fluorescence may occur, fluorescence intensity decreases.

"u" determines composition of Al and Ga, and fluorescence intensity becomes high when $0.2 \leq u \leq 0.6$. When especially "u" is 0.4, maximum fluorescence intensity can be obtained. When "u" is less than 0.2, above mentioned perovskite phase will be formed, and fluorescence intensity becomes low. When "u" is larger than 0.6, fluorescence intensity decreases, and afterglow increases sharply.

The range of x is set to 0<x<1.0 (here, x+z<1.0), and this fluorescent material certainly contains Lu or/and Y as L. By adding these elements, the average ionic radius of C site (eightfold coordination) in the garnet structure can be made small, and its lattice constant can be made small. Therefore, Al with small ionic radius can exist stably at A site (sixfold coordination). Therefore, formation of perovskite phase can be inhibited by setting "a", "u", and "z" to the above-mentioned range. Especially when L contains Lu, since the atomic weight of Lu is heavy, density of this fluorescent material can be made high and the absorption coefficient of X-ray can also be made large.

Although the maximum value of "a" is 0.15 as mentioned, also the minimum value may be 0.032 more preferably. If "a" becomes below 0.032, crack may be formed in the fluorescent material easily, and manufacturing yield will be lowered. Since Al located at A site (sixfold coordination) has small ionic radius, it enlarges a lattice strain. Excess rare earth ions go into A site (sixfold coordination) by setting the atomic ratio of C site (eightfold coordination) larger than 3. Therefore, the average ionic radius of A site (sixfold coordination) becomes large, and the lattice strain may be relaxed. However, if the value of "a" is 0.032 or less, this effect cannot be obtained effectively, and crack may be formed easily by the lattice strain. FIG. 4 shows the dependence of relative fluorescence intensity and manufacturing yield of the single crystal, to value of "a", when L is Lu, x=0.10, z=0.0027, and u=0.41. Here, relative fluorescence intensity means ratio (%) of the fluorescence intensity to the maximum fluorescence intensity (in this case, fluorescence intensity when a=0). Here, the yield (%) means the rate of the crystal in which crack was formed after grown by CZ method. Relative fluorescence intensity decreases gradually as "a" becomes large. And the yield is high between about 0.032<a<=0.15. Therefore, high fluorescence intensity, low afterglow intensity, and high yield can be obtained by setting "a" to the range of 0.032<a<=0.15. When "a" is 0.032 or less, the yield becomes low. When "a" is larger than 0.15, as mentioned, fluorescence intensity will become low and the yield will be lowered.

When L is Lu, especially fluorescence intensity can be made high by setting $0.033 \leq x \leq 0.5$ in the above-mentioned range for x. FIG. 5 shows the dependence of relative fluorescence intensity on x, when L is Lu, a=0.10, z=0.0026, and u=0.41. Here, relative fluorescence intensity means ratio (%) of the fluorescence intensity to the maximum fluorescence intensity (in this case, fluorescence intensity when x=0.10). When x is less than 0.1, since perovskite phase (different phase) may be generated, relative fluorescence intensity becomes low. And crack may be generated easily because of generation of different phase. To make relative fluorescence intensity high, range of 0.033<=x is preferred, and to inhibit crack generation by generation of different phase, range of 0.0925<x is more preferable. On the other hand, if x becomes large, fluorescence intensity will decrease gradually. If x is larger than 0.5, wavelength of the emitted light in this fluorescent material will become short. Therefore, since the sensitivity of photo-diode to light decreases, relative fluorescence intensity becomes low effectively.

When L is Y, especially fluorescence intensity can be made high by setting $0.066 \leq x \leq 0.67$ in the above-mentioned range for x. FIG. 6 shows the dependence of relative fluorescence intensity on x, when L is Y, a=0.10, z=0.0026, and u=0.41. Here, relative fluorescence intensity means ratio (%) of the fluorescence intensity to the maximum fluorescence intensity (in this case, fluorescence intensity when x=0.20). When x is less than 0.20, as well as the case of L=Lu, since different phase is generated, relative fluorescence intensity becomes low. And crack may be formed easily in the fluorescent material by generating of the different phase. To make relative fluorescence intensity high, range of $0.066<=x$ is preferred, and to inhibit crack generation by generation of different phase, range of $0.2<=x$ is more preferable. On the other hand, since Y atom is lighter than Gd atom (atomic weight of Gd is 157, and that of Y is 89), if x is larger than 0.67, the density of the whole fluorescent material will become low. Therefore, absorption of X-ray becomes insufficient.

Both Lu and Y can also be included to L. In that case, fluorescence intensity can be made high by setting ratio of Lu to Y into v:(1−v), (here, 0<v<1), and setting v in the range of $0.0925*v+0.2*(1-v)<x\leq 0.5v+0.67*(1-v)$.

To above mentioned fluorescent material of 3rd embodiment, other element (afterglow reduction dopant) may be doped also. By doping these elements, new energy levels are formed in the forbidden band of this fluorescent material. Therefore, transition of electron through the energy level leading to afterglow, can be inhibited.

However, by these elements, fluorescence made by transition from 5d level to 4f level by $Ce^{3+}$ is also affected, therefore fluorescence intensity is also changed. Therefore, the optimal range exists in the amount of dopants.

Scandium (Sc), that can be trivalent impurity, can be used as such an afterglow reduction dopant. FIG. 7 shows dependence of relative fluorescence intensity and afterglow intensity on Sc concentration, when L=Lu, a=0.12, x=0.096, z=0.0026, and u=0.41. Here, Sc concentration means the mol ratio (%) of Sc to this whole fluorescent material. Here, relative fluorescence intensity means ratio (%) of the fluorescence intensity to the fluorescence intensity without Sc doping. Here the value of afterglow intensity means a ratio (ppm) of the fluorescence intensity after 300 ms since X-ray irradiation stops, to the fluorescence intensity during the X-ray irradiation. Afterglow intensity decreases sharply by doping Sc slightly, but while doping more than 1 mol %, change of the afterglow intensity is little. On the other hand, relative fluorescence intensity takes the maximum at 2 mol %, and it decreases as Sc concentration becomes high. Therefore, preferable Sc concentration range is 0.004-10 mol % for setting relative fluorescence intensity 80% or higher, and setting afterglow intensity 20 ppm or lower. The range of 0.1-6 mol % is more preferable for setting relative fluorescence intensity 95% or higher, and setting afterglow intensity 10 ppm or higher. For both of above mentioned ranges, afterglow intensity becomes high if the concentration is lower than the minimum of the range, and fluorescence intensity becomes low if the concentration is higher than the maximum of the range.

Similarly, bivalent impurity such as magnesium (Mg), or tetravalent impurity such as titanium (Ti) may be doped as afterglow reduction dopant. FIG. 8 shows dependence of relative fluorescence intensity and afterglow intensity on Mg concentration in the same fluorescent material as mentioned above. Similarly, FIG. 9 shows dependence of relative fluorescence intensity and afterglow intensity on Ti concentration. Here, relative fluorescence intensity means ratio (%) of the fluorescence intensity to the fluorescence intensity without Mg or Ti doping. Here the value of afterglow intensity means a ratio (ppm) of the fluorescence intensity after 300 ms since X-ray irradiation stops, to the fluorescence intensity during the X-ray irradiation. Afterglow intensity decreases sharply by doping Mg or Ti slightly, but while doping more than 1 mol %, change of the afterglow intensity is little. On the other hand, relative fluorescence intensity decreases as Mg or Ti concentration becomes high. Therefore, preferable doping concentration range for both Mg and Ti, is 0.003-0.2 mol % for setting relative fluorescence intensity 80% or higher and setting afterglow intensity 20 ppm or lower. Moreover, the range of 0.01-0.1 mol % is more preferable for setting relative fluorescence intensity 95% or higher, and setting afterglow intensity 10 ppm or lower. For both of above mentioned ranges, afterglow intensity becomes high if the concentration is lower than the minimum of the range, and fluorescence intensity becomes low if the concentration is higher than the maximum of the range. Moreover, similar effects were found by doping bivalent impurity such as nickel (Ni).

As mentioned above, individual doping of each of Sc, Mg, Ni, and Ti which are afterglow reduction dopants, is effective, however, two or more species of dopants may be doped simultaneously, even in this case, afterglow intensity can be similarly made low.

For manufacturing the single crystal of this fluorescent material, CZ method or FZ method is used as the material of the 2nd embodiment. These method can be carried similarly as the concrete manufacturing method. A concrete manufacturing method is carried similarly also. In this case, as raw materials for afterglow reduction dopants, such as Sc, Mg, Ni, and Ti, $Sc_2O_3$, MgO, NiO, and $TiO_2$ may be used, respectively, for example.

In manufacturing this fluorescent material by CZ method, for example, to set the composition u=0.4, $Al_2O_3$ (raw material of Al) and $Ga_2O_3$ (raw material of Ga) are mixed and sintered and the ceramics is obtained, so that the molar ratio of Al to Ga should be 3.0:2.0 in the single crystal of this fluorescent material. This ceramics is molten by heating, and single crystal is grown by CZ method. However, when manufacturing this fluorescent material by CZ method, the molar ratio of Al to Ga in the single crystal finally grown is different from that in the raw materials. Because, especially Ga component segregates or evaporates during the single crystal growth. Specifically, by setting the molar ratio of Al to Ga in the raw materials to 2.8:2.2, this ratio in the single crystal finally grown was set to 3.0:2.0. Thus, although the molar ratio of Al to Ga in this fluorescent material is (1−u):u, this molar ratio in the raw materials (starting material) for manufacturing the ceramics is set to (1−k*u):(k*u). Here, k may be 1.005-1.3 preferably. Although described above on CZ method, this manufacturing method can be applied to FZ method similarly, because in FZ method, the ceramics are manufactured and the ceramics are molten quite similarly as in CZ method.

In order to make afterglow of this fluorescent material lower further, heat treatment can also be done. The number of energy levels causing afterglow formed by oxygen defect may be decreased by this heat treatment. Therefore, afterglow intensity can be made low, keeping fluorescence intensity high. In this heat treatment, the temperature is preferred to be in the range of 1100-1800 degrees C. During the heat treatment, oxygen is preferred to be contained in the atmosphere, and the oxygen concentration is preferred to be 0.01 vol % or more. FIG. 10 shows the dependence of the afterglow intensity (300 ms later since irradiation stops) on the temperature in the heat treatment, when L=Lu, a=0.12, x=0.096, z=0.0026, u=0.41, and Mg concentration is 0.04 mol %. Here, the heat treatment was done for 2 hours and under the atmosphere with 100 vol % oxygen. After heat treatment at 1100 degrees C. or higher is done, after glow intensity become slower than that before the heat treatment. At the temperature higher than 1800 degrees C., since this fluorescent material softens and is deformed, the heat treatment cannot be applied. FIG. 11 shows the dependence of the afterglow intensity on the oxygen concentration in the atmosphere, when the heat treatment temperature is 1500 degrees C. and the time of the treatment is 2 hours. When oxygen concentration is high, afterglow intensity will decrease. As a result, the oxygen concentration higher than 0.01 vol % is effective for reduction of afterglow intensity.

As well as the case of the 2nd embodiment, when this fluorescent material is polycrystal, this polycrystal material is manufactured as ceramics using hot press or hot isostatic press (HIP) method. Although the fluorescence intensity of the polycrystal is lower compared with the single crystal with the same composition, since the polycrystal can be manufactured cheaply, it becomes cheap.

A 4th Embodiment)

The radiation detector of a 4th embodiment is explained.

In the fluorescent material of the 1st-3rd embodiments described, especially when this material is single crystal, the transmittance of visible light in the material can be raised especially. Therefore, fluorescence output can be taken out even if the thickness of the crystal is large. Therefore, when this fluorescent material is used for a scintillator, problems such as the decrease of X-ray sensitivity or the leakage of X-ray, will be solved. Therefore, a radiation detector with high performance can be obtained. On the other hand, using the polycrystal of this material, transmittance is lower than that using the single crystal with same composition, and the performance of the detector becomes lower. However, since the fluorescent material can be obtained cheaply, as this fluorescent material is used for a scintillator, a cheap radiation detector is obtained. In the fluorescent material of the 1st-3rd embodiments, when the transmittance of light with wavelength of 550 nm is 60% or higher, the thickness can be made large regardless of whether this material is single crystal or polycrystal. Therefore, this radiation detector is used, without leakage of X-ray.

This radiation detector is composed of a scintillator and the photodetector for detecting fluorescence from this fluorescent material. The above-mentioned fluorescent material is used as the scintillator. As a photodetector, PIN type photodiode is preferred, because of high sensitivity with quick response and of detectable wavelength range that fit for this fluorescent material from visible light to near infrared. As the thickness range of the fluorescent material used for this detector, 0.5-10 mm is preferred. When the thickness is smaller than 0.5 mm, fluorescence output will decrease, and the leakage of X-ray will increase. On the other hand, when the thickness is larger than 10 mm, the weight of the detective element itself will become heavy, therefore, for apparatus as X-ray CT scanner, in which the detective element is rotated at high speed, it does not fit. In order to get high fluorescence intensity, to avoid decay of the emitted light and to get the radiation detector with high performance, the thickness of the scintillator is preferred to be 1.5-3 mm.

Generally, polycrystal material may be broken easily during machining, because of its fragility. Therefore, it is difficult to set length of one side in the detective surface of the fluorescence material small, and to use it. However, when especially this fluorescence material is single crystal, since this material contains garnet structure, there is no fragility like polycrystal. Therefore, the processing loss resulting from chipping or breakage can be reduced greatly. Therefore, making the material be 1 mm or smaller in its size is possible. Therefore, since mechanical strength is high, if a length of one side of an detective surface is set to 0.5 mm or smaller, this material will be machined with low probability of breakage. Therefore, it is possible to make a length of one side of the detective surface of the scintillator 0.5-1 mm, and especially the scintillator with this detective surface fits for the detector used for the multi-slice X-ray CT scanner on which high resolution is demanded. On the other hand, this fluorescent material used for a scintillator is excellent in transmittance compared with the polycrystal material. Therefore, even when the scintillator is thick, decay of the emitted light is inhibited. Therefore, it is possible to make the scintillator thicker than that in which the polycrystal material is used, and X-ray is fully absorbed in a scintillator and leakage of X-ray is inhibited. To inhibit the leakage of X-ray more certainly, thickness of a scintillator is preferred to be 7-10 mm.

A 5th Embodiment

A X-ray CT scanner of a 5th embodiment is explained.

This X-ray CT scanner comprises an X-ray source which radiates X-ray, and an X-ray detector facing it. The radiation detector concerning said 4th embodiment is used as this X-ray detector. The X-ray source and the X-ray detector facing it, are set on the rotating body which is operated to rotate around a sample. And while the rotating body rotates, the X-ray emitted by the sample is detected by the X-ray detector. A picture of the tomogram for the sample is taken based on the X-ray intensity. A combination of the above-mentioned fluorescent material of this invention and PIN type photo-diode is used as the X-ray detector. By using this X-ray detector, the detection efficiency of the X-ray is improved and the afterglow decreases. Therefore, compared with X-ray CT scanner with which the conventional scintillator was used, the X-ray CT scanner with high sensitivity, high definition, and high resolution is obtained.

EXAMPLE

This invention is concretely explained by the example below.

First, as examples 1-3, single crystal fluorescent material with garnet structure, comprising Ce, Gd, Al, Ga, and O, here Ga/(Gd+Ga+Al+Ce) is 0.2-0.3, Al/(Gd+Ga+Al+Ce) is 0.35-0.4 and Ce/(Gd+Ga+Al+Ce) is 0.0005-0.006 as ratios of atomic number, were manufactured. Fluorescence intensity and transmittance of light at wavelength of 550 nm of these examples were measured. In the sample for fluorescence intensity measurement, the white paint containing titanium oxide mainly was painted on all faces except for the bottom face. As shown in FIG. 12, X-ray tube 1, this sample (fluorescent material) 3, and photo-diode 5 have been arranged, and fluorescence intensity under exposure of X-ray generated when the tube voltage is 110kV and the current is 5 mA, was measured. Composition of the fluorescent material was measured by ICP spectrometry. Similar measurements were performed also on comparative examples 1-3.

Example 1

214.5 g of $Gd_2O_3$, 1.7 g of $Ce(NO_3)_3.6H_2O$ and 74.2 g of $Ga_2O_3$, and 60.5 g of $Al_2O_3$ were weighed out. Next, these raw materials were wet blended for 16 hours by ball mill. Next, the blended powder of these raw materials is put into an alumina crucible, and after covering with a lid made of alumina, calcination of temperature at 1400 degrees C. was done for 2 hours in the air. The heating rate was set to 300 degrees C./hr. After cooling, the material was broken up, that were packed into a rubber tube. The cold isostatic press was performed at pressure of 98 MPa, and forming body with bar shape was made. Then, this forming body was put into a sagger made of alumina, and after covering with a lid, sintering at 1500 degrees C. was performed for 2 hours in the air. The heating rate was set to 300 degrees C./hr.

These ceramics were used as material rod and the seed crystal, and crystal growth was performed using FZ method. The material rod was set at the top and the seed crystal was set at the bottom, so that these are arranged to be in line in vertical direction in the apparatus. By the focused light of a lamp, at the lowermost part of the material rod, the material rod is molten, and the seed crystal is pulled up gradually and is contacted to this liquid phase portion. Then, a crystal was grown under the liquid phase, after the liquid phase portion moved upwards by moving mirror upwards. Atmosphere for the crystal growth was mixed gas of oxygen with argon, and the oxygen concentration was set to 50%. Moving speed of the mirror was set to 2 mm/hr, and after the crystal growth was started, the material rod was moved downwards at moving rate of 0.5 mm/hr immediately. The material rod was pulled up when the length of the grown crystal was about 20 mm. Thereby, the material rod was separated from the crystal and cooled to room temperature in about 4 hours. The cooling rates at this time were 7.5 degrees C./min. After being machined into 3 mm thick by inner circle slicer, the surfaces were polished, then single crystal fluorescent materials were manufactured as above mentioned samples. On the cutted pieces of the grown crystals and the above-mentioned material rods used as the crude materials, composition analysis by ICP luminescence spectrometry was done. To investigate fluorescence characteristics, emission spectrum measurement when light with wavelength of 330 nm is emitted, was performed. The light emission wavelength spectrum to light with wavelength of 330 nm is shown in FIG. 13. In this figure, the intense signal located at 660 nm is generated by exposure of excitation light at wavelength of 330 nm upon the detector, therefore it does not correspond to the fluorescence from this fluorescent material.

Example 2

The fluorescent material was manufactured by the method as example 1 except that the moving rate of the mirror during the crystal growth was 4 mm/hr and the moving rate of the material rod was 1 mm/hr. The obtained crystal was machined into 3 mm thick slice, and the surfaces were polished, and the single crystal of the fluorescent material was manufactured as a sample.

Example 3

Except that 183.3 g of $Gd_2O_3$, 2.95 g of $Ce(NO_3)_3.6H_2O$, 63.6 g of $Ga_2O_3$, and 51.9 g of $Al_2O_3$ were weighed out, the fluorescent material was manufactured by the similar method as example 1. The obtained crystal was machined into 3 mm thick slice, and the surfaces were polished, and the single crystal of the fluorescent material was manufactured as a sample.

In addition, as afterglow in Examples 1-3, ratio of the fluorescence intensity after 30 ms since X-ray irradiation stopped to the fluorescence intensity during the X-ray irradiation, was measured, however each of these ratios was as low as 0.01%.

Comparative Example 1

Except that 134.2 g of $Gd_2O_3$, 1.1 g of $Ce(NO_3)_3.6H_2O$, 92.8 g of $Ga_2O_3$, and 12.6 g of $Al_2O_3$ were weighed out as raw materials, and atmospheric gas during the crystal growth was pure argon, fluorescent material was manufactured by the similar method as example 1. The obtained crystal was machined into 3 mm thick slice, and the surfaces were polished, and the single crystal of the fluorescent material was manufactured as a sample.

Comparative Example 2

135.48 g of $Gd_2O_3$, 0.883 g of $Ce_2(C_2O_4)_3.9H_2O$, 38.16 g of $Al_2O_3$, 0.31 g of $Si(OC_2H_5)_4$, 50.61 g of $Ga_2O_3$, and 21.92 g of $BaF_2$ were weighed out. Next, after these raw materials were mixed with the wet ball mill, these were dried. Next, the mixed powder of these raw materials was put in a crucible made of alumina, and after covering with a lid made of alumina, calcination was carried out at 1500 degrees C. for 2 hours in the air. After cooling, the material was broken up, and cleaned for 2 hours by 4N hydrochloric acid by stirrer, and was cleaned again by pure water, and dried later. And ball milling was performed for 24 hours. In this way, the scintillator pulverized powder with average particle diameter of 0.7 micrometer was obtained. The pure water of 5 mass % was added to these pulverization powder, and uniaxial pressing was carried out at pressure of 49 MPa, then, the cold isostatic press was carried out at pressure of 294 MPa, and a forming body was acquired. This forming body was put into a sagger made of alumina, and covered with a lid, and 1st sintering at 1625 degrees C. for 3 hours were performed under nitrogen atmosphere. Thereby, ceramics with density of 98% to ideal density were obtained. To these ceramics, hot isostatic press sintering was performed at pressure of 100 MPa, at 1500 degrees C., for 3 hours, and a polycrystal of GGAG:Ce was obtained. The obtained ceramics had density of 99.9% to ideal density. The obtained crystal was machined into 3 mm thick slice, and polycrystal of the fluorescent material was manufactured as a sample.

Comparative Example 3

333 g of $Gd_2O_3$, 0.35 g of $Pr_6O_{11}$, 96 g of $Na_2CO_3$, 10 g of $Li_2B_4O_7$, 3 g of $NaBF_4$, 32 g of $K_3PO_4.3H_2O$, and 105 g of S were weighed out and they were mixed in dry condition. Next, 1.3 g of $Ce(NO_3)_3.6H_2O$ dissolved to 500 g of pure water, and 2 ml of the solution was added to above mentioned raw material. After putting the raw material into a crucible made of alumina and covering with a lid made of alumina, sintering was carried out at 1250 degrees C. for 21 h. After cooling, the material was broken up. The material was cleaned by pure water, and later, was cleaned for 2 hours by 4N hydrochloric acid at 90 degrees C by stirrer. In this way, the scintillator material pulverized powder of $Gd_2O_2S$:Pr(Ce, F) with average particle diameter of 44 micrometers was obtained. After 0.1 mass % of $Li_2GeF_6$ was added as a sintering aid, the capsule made of mild steel was filled with the powder, and the capsule was vacuum sealed. Then, the hot isostatic press (HIP) was carried out at 1300 degrees C., at 10 MPa, for 2 h. Then, it was machined into 1.2-mm-thick plate with a section of 30 mm 20 mm. Then, sintering at 1100 degrees C. for 1 h under argon gas atmosphere was carried, and polycrystal of the fluorescent material was manufactured as a sample.

The composition (ratio of atomic number) in the above-mentioned examples 1-3 and comparative example 1 is shown in Table 3. Relative fluorescence intensity and transmittance at wavelength of 550 nm are shown in Table 4 about examples 1-3 and comparative examples 1-3. In Table 4, relative fluorescence intensity is relative value in which the value of GGAG:Ce polycrystal (comparative example 2) is set to 100.

Shown transmissions in comparative example 2 and comparative example 3 are the diffuse transmittance obtained by the measurement using an integrating sphere. All, examples 1-3 have high transmission compared with comparative examples 1-3, and also have high fluorescence intensity.

TABLE 3

| | Ga/(Gd + Ga + Al + Ce) | Al/(Gd + Ga + Al + Ce) | Ce/(Gd + Ga + Al + Ce) | Gd/(Gd + Ga + Al + Ce) |
|---|---|---|---|---|
| Example. 1 | 0.255 | 0.377 | 0.00126 | Residue |
| Example. 1 (Material Rod) | 0.253 | 0.376 | 0.00127 | Residue |
| Example. 2 | 0.257 | 0.372 | 0.00121 | Residue |
| Example. 3 | 0.235 | 0.384 | 0.00183 | Residue |
| Comparative Example. 1 | 0.488 | 0.139 | 0.00086 | Residue |

TABLE 4

| Material | Crystal | Principal Wavelength (nm) | Relative Fluorescence Intensity | Transmittance (% at 550 nm) |
|---|---|---|---|---|
| Example. 1 | Cubic | 550 | 140 | 73 |
| Example. 2 | Cubic | 550 | 121 | 67 |
| Example. 3 | Cubic | 550 | 133 | 72 |
| Compararive Example. 1 | Cubic | 550 | 70 | 71 |
| GGAG: Ce Polycrystal (Comparative Example. 2) | Cubic | 550 | 100 | <50 |
| GOS: Pr Ceramics (Comparative Example. 3) | Hexagonal | 512 | 110 | <45 |

Next, fluorescent materials expressed as $Gd_{3-p-q}Lu_pCe_qAl_rGa_{5-r}O_{12}$, here, $0.1 \leq p \leq 3.0$, $0.001 \leq q \leq 0.05$, and $2 \leq r \leq 4$, were manufactured as examples 4-10. Absorption coefficient at 80 keV in X-ray energy, fluorescence intensity, and afterglow intensity on these examples, and also on comparative examples 4-6, were investigated. The absorption coefficient at 80 keV in X-ray energy was computed based on the absorption coefficient of each component elements. Fluorescence intensity, afterglow intensity (after 30 ms), and composition of fluorescent materials were measured by similar method as example 1 etc.

Example 4

180.34 g of $Gd_2O_3$, 99.48 g of $Lu_2O_3$, 2.17 g of $Ce(NO_3)_3 \cdot 6H_2O$, 76.47 g of $Al_2O_3$, and 93.72 g of $Ga_2O_3$ were weighed out. Next, these raw materials were wet blended by ball mill for 12 hours. Next, the mixed powder of these raw materials was put in a crucible made of alumina, and after covering with a lid made of alumina, calcination was carried out at 1400 degrees C. for 2 hours in the air. After cooling, the material was broken up, that were packed into a rubber tube. The cold isostatic press was performed at pressure of 98 MPa, and forming body with bar shape was made. This forming body was put into a sagger made of alumina, and covered with a lid, and sintering at 1500 degrees C. for 2 hours were performed in the air. Crystal growth was done by FZ method, using these ceramics as material rods and as seed crystals. The material rod was set at the top and the seed crystal was set at the bottom, so that these are arranged to be in line in vertical direction in the apparatus. By the focused light of a lamp, at the lowermost part of the material rod, the material rod is molten, and the seed crystal is pulled up gradually and is contacted to this liquid phase portion. Atmosphere for the crystal growth was mixed gas of oxygen with argon, and the oxygen concentration was set to 3%. Moving speed of the mirror was set to 2 mm/hr, and after the crystal growth was started, the material rod was moved downwards at moving rate of 0.5 mm/hr immediately. The material rod was pulled up when the length of the grown crystal was about 20 mm. Thereby, the material rod was separated from the crystal and cooled to room temperature in about 4 hours. The cooling rates at this time were 7.5 degrees C./min. After being machined into 3 mm thick by inner circle slicer, the surfaces were polished, then single crystal fluorescent materials were manufactured as above mentioned samples.

Example 5

Except that 89.72 g of $Gd_2O_3$, 198.97 g of $Lu_2O_3$, 2.17 g of $Ce(NO_3)_3 \cdot 6H_2O$, 76.47 g of $Al_2O_3$, and 93.72 g of $Ga_2O_3$ were weighed out and were used as raw material, single crystal of the fluorescent material was manufactured by similar method as example.4.

Example 6

Except that 177.63 g of $Gd_2O_3$, 99.48 g of $Lu_2O_3$, 8.68 g of $Ce(NO_3)_3 \cdot 6H_2O$, 76.47 g of $Al_2O_3$, and 93.72 g of $Ga_2O_3$ were weighed out and were used as raw material, single crystal of the fluorescent material was manufactured by similar method as example.4.

Example 7

Except that 180.34 g of $Gd_2O_3$, 99.48 g of $Lu_2O_3$, 2.17 g of $Ce(NO_3)_3 \cdot 6H_2O$, 50.98 g of $Al_2O_3$, and 140.58 g of $Ga_2O_3$ were weighed out and were used as raw material, single crystal of the fluorescent material was manufactured by similar method as example.4.

Example 8

Except that 180.34 g of $Gd_2O_3$, 99.48 g of $Lu_2O_3$, 2.17 g of $Ce(NO_3)_3 \cdot 6H_2O$, 101.96 g of $Al_2O_3$, and 46.86 g of $Ga_2O_3$ were weighed out and were used as raw material, single crystal of the fluorescent material was manufactured by similar method as example.4.

Example 9

180.34 g of $Gd_2O_3$, 99.48 g of $Lu_2O_3$, 2.17 g of $Ce(NO_3)_3 \cdot 6H_2O$, 76.47 g of $Al_2O_3$, and 93.72 g of $Ga_2O_3$ were weighed. Next, these raw materials were wet blended for 12 hours by ball mill. Next, the blended powder of these raw materials is put into an alumina crucible, and after covering with a lid made of alumina, calcination of temperature at 1400 degrees C. was done for 2 hours in the air. This calcination powder was ball milled in wet condition for 12 hours, and press forming was carried out at pressure of 50 MPa using a die, and also CIP forming was done at pressure of 300 MPa. The obtained formed object was put into a sagger made of alumina, and calcination was carried at temperature of 1650 degrees C., for 3 hours in nitrogen atmosphere. Then, HIP sintering at 100 MPa, 1500 degrees C, for 4 hours, was performed and polycrystal of the fluorescent material was manufactured as a sample.

Example 10

Except that 89.72 g of $Gd_2O_3$, 198.97 g of $Lu_2O_3$, 2.17 g of $Ce(NO_3)_3 \cdot 6H_2O$, 76.47 g of $Al_2O_3$, and 93.72 g of $Ga_2O_3$ were weighed and used as raw material, polycrystal of the fluorescent material was manufactured by similar method as example.9.

Comparative Example 4

Except that 270.96 g of $Gd_2O_3$, 2.17 g of $Ce(NO_3)_3 \cdot 6H_2O$, 76.47 g of $Al_2O_3$, and 93.72 g of $Ga_2O_3$ were weighed and used as raw material, single crystal of the fluorescent material was manufactured by similar method as example.4.

Comparative Example 5

Except that 180.34 g of $Gd_2O_3$, 99.48 g of $Lu_2O_3$, 2.17 g of $Ce(NO_3)_3 \cdot 6H_2O$, and 234.30 g of $Ga_2O_3$ were weighed and used as raw material, single crystal of the fluorescent material was manufactured by similar method as example.9.

Comparative Example 6

Except that 180.34 g of $Gd_2O_3$, 99.48 g of $Lu_2O_3$, 15.20 g of $Ce(NO_3)_3 \cdot 6H_2O$, 76.47 g of $Al_2O_3$, and 93.72 g of $Ga_2O_3$ were weighed and used as raw material, single crystal of the fluorescent material was manufactured by similar method as example.6.

Composition in the above-mentioned examples 4-10 and comparative examples 4-6, X-ray absorption coefficient, fluorescence intensity, and afterglow intensity are shown in Table 5. In table. 5, the value of fluorescence intensity means a relative value when setting that of $CdWO_4$ single crystal to 100. And the value of afterglow intensity means a ratio (%) of the fluorescence intensity after 30 ms since X-ray irradiation stops, to the fluorescence intensity during the X-ray irradiation. Examples 4-10 have large absorption coefficient and high fluorescence intensity, compared with comparative examples 4-6. Afterglow was also equivalent or less than comparative examples. The fluorescence intensity of the single crystal became larger than that of the polycrystal with same composition. Comparative example 4 does not contain Lu, and comparative example 5 does not contain Al, and comparative example 6 does not have Ce with the optimal composition range. Therefore, characteristics equivalent to this invention were not obtained.

Next, fluorescent materials expressed as $(Gd_{1-x-z}L_xCe_z)_{3+a}(Al_{1-u}Ga_u)_{5-a}O_{12}$, here, $0.032 < a \leq 0.15$, $0.0003 \leq z \leq 0.0167$, $0.2 \leq u \leq 0.6$, $0.0925 \leq x \leq 0.5$ (when L=Lu), $0.2 \leq x \leq 0.67$ (when L=Y), were manufactured as examples 11-20. As afterglow reduction dopants, Mg, Ti and/or Sc were doped. On these examples, fluorescence intensity, afterglow intensity (after 30 ms and 300 ms), composition of the fluorescence materials were investigated also on comparative examples 7-11. These were measured by the similar method as example.1. The crack generated in the obtained fluorescent material was also checked visually.

Example 11

1529.22 g of $Gd_2O_3$, 178.78 g of $Lu_2O_3$, 10.567 g of $Ce(NO_3)_3 \cdot 6H_2O$, 440.35 g of $Al_2O_3$, and 562.56 g of $Ga_2O_3$ were weighed out. Next, after these raw materials were mixed with the wet ball mill, the mixed powder of these raw materials was put in a B5 sized crucible made of alumina, and calcination was carried out at 1400 degrees C. for 2 hours. And after cooling, the material was broken up. Obtained materials were packed into a rubber tube, and cold isostatic press was performed at pressure of 98 MPa, and forming body with bar shape was made. After this forming body was molten by RF heating in an iridium crucible, the seed crystal was immersed and single crystal with 2 inch size was grown by CZ method at pulling speed of 1 mm/h and at revolution of 10 rpm. The atmosphere for the growth is the nitrogen gas containing 2 vol % of oxygen. The growth direction was made into <111> directions. After being machined into 3 mm thick by inner circle slicer, heat treatment at 1500 degrees C. in 100% oxygen atmosphere for 2 hours, was carried. The heating rate in the heat treatment was 300 degrees C./h. After the heat treatment, the surfaces were polished, and single crystal of the fluorescent material was manufactured as a sample.

Example 12

Except that 1529.22 g of $Gd_2O_3$, 178.78 g of $Lu_2O_3$, 10.567 g of $Ce(NO_3)_3 \cdot 6H_2O$, 440.35 g of $Al_2O_3$, 562.56 g of $Ga_2O_3$, and 0.048 g of MgO were weighed out and were used as raw materials, single crystal of the fluorescent material was manufactured by similar method as example.11.

Example 13

Except that 1318.09 g of $Gd_2O_3$, 362.91 g of $Lu_2O_3$, 10.296 g of $Ce(NO_3)_3 \cdot 6H_2O$, 447.57 g of $Al_2O_3$, 571.78 g of

TABLE 5

| | Composition $Gd_{3-p-q}Lu_pCe_qAl_rGa_{5-r}O_{12}$ | | | Absorption Coefficient ($cm^{-1}$) | Fluorescence | Afterglow Intensity (%) | |
|---|---|---|---|---|---|---|---|
| | p | q | r | at 80 KeV | Intensity | at 30 ms | Crystal |
| Example. 4 | 1 | 0.01 | 3 | 22.7 | 230 | 0.01 | Single |
| Example. 5 | 2 | 0.01 | 3 | 25.7 | 220 | 0.01 | Single |
| Example. 6 | 1 | 0.04 | 3 | 22.7 | 200 | 0.01 | Single |
| Example. 7 | 1 | 0.01 | 2 | 22.5 | 190 | 0.01 | Single |
| Example. 8 | 1 | 0.01 | 4 | 22.2 | 170 | 0.01 | Single |
| Example. 9 | 1 | 0.01 | 3 | 22.7 | 190 | 0.01 | Poly |
| Example. 10 | 2 | 0.01 | 3 | 25.7 | 180 | 0.01 | Poly |
| Comparative Example. 4 | 0 | 0.01 | 3 | 19.8 | 170 | 0.01 | Single |
| Comparative Example. 5 | 1 | 0.01 | 0 | 22.8 | 110 | 0.03 | Single |
| Comparative Example. 6 | 1 | 0.07 | 3 | 22.7 | 140 | 0.01 | Single |

$Ga_2O_3$, and 0.048 g of $TiO_2$ were weighed out and were used as raw material, single crystal of the fluorescent material was manufactured by similar method as example.11.

Example 14

Except that 1354.91 g of $Gd_2O_3$, 376.05 g of $Lu_2O_3$, 10.669 g of $Ce(NO_3)_3.6H_2O$, 437.64 g of $Al_2O_3$, 559.10 g of $Ga_2O_3$, and 4.137 g of $Sc_2O_3$ were weighed out and were used as raw material, single crystal of the fluorescent material was manufactured by similar method as example.11.

Example 15

Except that 1498.74 g of $Gd_2O_3$, 176.49 g of $Lu_2O_3$, 10.432 g of $Ce(NO_3)_3.6H_2O$, 443.96 g of $Al_2O_3$, 567.17 g of $Ga_2O_3$, 0.048 g of MgO, and 4.137 g of $Sc_2O_3$ were weighed out and were used as raw material, single crystal of the fluorescent material was manufactured by similar method as example.11.

Example 16

Except that 1006.17 g of $Gd_2O_3$, 744.93 g of $Lu_2O_3$, 2.032 g of $Ce(NO_3)_3.6H_2O$, 559.77 g of $Al_2O_3$, 343.02 g of $Ga_2O_3$, 0.048 g of MgO, 0.048 g of $TiO_2$, and 4.137 g of $Sc_2O_3$ were weighed out and were used as raw material, single crystal of the fluorescent material was manufactured by similar method as example.11.

Example 17

Except that 1516.66 g of $Gd_2O_3$, 178.78 g of $Lu_2O_3$, 40.643 g of $Ce(NO_3)_3.6H_2O$, 335.86 g of $Al_2O_3$, 754.65 g of $Ga_2O_3$, and 0.048 g of MgO were weighed out and were used as raw material, single crystal of the fluorescent material was manufactured by similar method as example.11.

Example 18

Except that 1352.78 g of $Gd_2O_3$, 211.36 g of $Y_2O_3$, 10.567 g of $Ce(NO_3)_3.6H_2O$, 440.35 g of $Al_2O_3$, 562.56 g of $Ga_2O_3$, and 0.048 g of MgO were weighed out and were used as raw material, single crystal of the fluorescent material was manufactured by similar method as example.11.

Example 19

Except that 1478.34 g of $Gd_2O_3$, 178.77 g of $Lu_2O_3$, 31.71 g of $Y_2O_3$, 10.565 g of $Ce(NO_3)_3.6H_2O$, 440.34 g of $Al_2O_3$, 562.56 g of $Ga_2O_3$, and 0.048 g of MgO were weighed out and were used as raw material, single crystal of the fluorescent material was manufactured by similar method as example.11.

Example 20

Used raw materials were same as example 11, and after being mixed with ball mill in wet condition, these raw materials were dried. Next, the mixed powder of these raw materials was put in a B5 sized crucible made of alumina, and calcination was carried out at 1200 degrees C. for 2 hours. And after cooling, the material was broken up. In this way, the scintillator pulverized powder with average particle diameter of 1 micrometer was obtained. The pure water of 5 mass % was added to these pulverization powder, and uniaxial pressing was carried out at pressure of 500 kg/cm², then, the cold isostatic press was carried out at pressure of 3 ton/cm², and a forming body, with density of 64% to ideal density, was acquired. This forming body was put into a sagger made of alumina, and covered with a lid, and 1st sintering at 1625 degrees C. for 3 hours were performed under nitrogen atmosphere. Thereby, ceramics with density of 98% to ideal density were obtained. In order to get uniform ceramics with high density, the heating rate at temperature higher than 1350 degrees C. was set to 50 degrees C./h. Hot isostatic press sintering at 1500 degrees C., at 1 10⁸ Pa, for 3 hours was performed in Ar atmosphere to these ceramics. The obtained ceramics had 99.9% of density to ideal density. The obtained crystal was machined into 3 mm thick slice, and heat treatment at 1500 degrees C. for 2 hours in oxygen atmosphere was carried. The heating rate of the heat treatment was set to 300 degrees C./h. After the heat treatment, the surfaces were polished, and a polycrystal of the fluorescent material was manufactured as a sample.

Comparative Example 7

Except that 1568.43 g of $Gd_2O_3$, 183.37 g of $Lu_2O_3$, 10.84 g of $Ce(NO_3)_3.6H_2O$, 433.13 g of $Al_2O_3$, and 553.33 g of $Ga_2O_3$ were weighed out and were used as raw material, single crystal of the fluorescent material was manufactured by similar method as example.11.

Comparative Example 8

Except that 1568.43 g of $Gd_2O_3$, 183.37 g of $Lu_2O_3$, 10.84 g of $Ce(NO_3)_3.6H_2O$, 433.13 g of $Al_2O_3$, 553.33 g of $Ga_2O_3$, and 0.048 g of MgO were weighed out and were used as raw material, single crystal of the fluorescent material was manufactured by similar method as example.11.

Comparative Example 9

Except that 674.19 g of $Gd_2O_3$, 1117.39 g of $Lu_2O_3$, 10.57 g of $Ce(NO_3)_3.6H_2O$, 440.35 g of $Al_2O_3$, 562.56 g of $Ga_2O_3$, and 0.048 g of MgO were weighed out and were used as raw material, single crystal of the fluorescent material was manufactured by similar method as example.11.

Comparative Example 10

Except that 1503.09 g of $Gd_2O_3$, 178.78 g of $Lu_2O_3$, 73.16 g of $Ce(NO_3)_3.6H_2O$, 440.35 g of $Al_2O_3$, 562.56 g of $Ga_2O_3$, and 0.048 g of $TiO_2$ were weighed out and were used as raw material, single crystal of the fluorescent material was manufactured by similar method as example.11.

Comparative Example 11

Except that 1529.22 g of $Gd_2O_3$, 178.78 g of $Lu_2O_3$, 10.57 g of $Ce(NO_3)_3.6H_2O$, 223.91 g of $Al_2O_3$, 960.46 g of $Ga_2O_3$, and 0.048 g of $TiO_2$ were weighed out and were used as raw material, single crystal of the fluorescent material was manufactured by similar method as example.11.

Composition, fluorescence intensity (here, the intensity of $CdWO_4$ is set to 100), afterglow intensity (after 30 ms and 300 ms), and the state of the crystal after the manufacture, of the above-mentioned examples 11-20 and comparative examples 7-11, are shown in Table 6. In example 11, in which Lu was used as L without doping of afterglow reduction dopant, higher fluorescence intensity was obtained by setting a to 0.12, than comparative example 7, and also generation of crack was inhibited. Also in example 12, in which Mg was doped as an afterglow reduction dopant, higher fluorescence intensity than example 12, which was single crystal. However, compared with comparative examples 7-11, fluorescence intensity was higher, and afterglow intensity was lower, similar to example 12.

TABLE 6

| | Composition $(Gd_{1-x-z}L_xCe_z)_{3+a}(Al_{1-u}Ga_u)_{5-a}O_{12}$ | | | | | Doping | Fluorescence Intensity | Afterglow Intensity (ppm) | | Crystal |
|---|---|---|---|---|---|---|---|---|---|---|
| | a | x | z | u | L | (mol %) | (to $CdWO_4$) | 30 ms | 300 ms | |
| Example. 11 | 0.12 | 0.096 | 0.0026 | 0.41 | Lu | None | 195 | 187 | 30 | Single |
| Comparative Example. 7 | 0.2 | 0.096 | 0.0026 | 0.41 | Lu | None | 132 | 175 | 28 | Single(Cracked) |
| Example. 12 | 0.12 | 0.096 | 0.0026 | 0.41 | Lu | Mg: 0.04 | 205 | 108 | 8 | Single |
| Comparative Example. 8 | 0.2 | 0.096 | 0.0026 | 0.41 | Lu | Mg: 0.04 | 139 | 110 | 7 | Single(Cracked) |
| Comparative Example. 9 | 0.12 | 0.6 | 0.0026 | 0.41 | Lu | Mg: 0.04 | 92 | 135 | 13 | Single |
| Example. 13 | 0.04 | 0.2 | 0.0026 | 0.41 | Lu | Ti: 0.02 | 187 | 105 | 7 | Single |
| Comparative Example. 10 | 0.12 | 0.096 | 0.018 | 0.41 | Lu | Ti: 0.02 | 90 | 65 | 7 | Single |
| Comparative Example. 11 | 0.12 | 0.096 | 0.0026 | 0.7 | Lu | Ti: 0.02 | 93 | 1342 | 217 | Single |
| Example. 14 | 0.15 | 0.2 | 0.0026 | 0.41 | Lu | Sc: 2.00 | 196 | 121 | 9 | Single |
| Example. 15 | 0.08 | 0.096 | 0.0026 | 0.41 | Lu | Mg: 0.04 Sc: 2.00 | 223 | 75 | 8 | Single |
| Example. 16 | 0.12 | 0.4 | 0.0005 | 0.25 | Lu | Mg: 0.04 Ti: 0.02 Sc: 2.00 | 151 | 227 | 21 | Single |
| Example. 17 | 0.12 | 0.096 | 0.01 | 0.55 | Lu | Mg: 0.04 | 174 | 142 | 15 | Single |
| Example. 18 | 0.12 | 0.2 | 0.0026 | 0.41 | Y | Mg: 0.04 | 209 | 99 | 8 | Single |
| Example. 19 | 0.12 | Lu: 0.096 Y: 0.030 | 0.0026 | 0.41 | Lu Y | None | 187 | 192 | 31 | Single |
| Example. 20 | 0.12 | 0.096 | 0.0026 | 0.41 | Lu | Mg: 0.04 | 174 | 128 | 13 | Poly | intensity was obtained by setting "a" to 0.12, than comparative example 8, and also generation of crack was inhibited. Also in example 12, in which Mg was doped as an afterglow reduction dopant, a little higher fluorescence intensity than example 11 in which no afterglow reduction dopant was doped, and low afterglow intensity were obtained. In comparative example 9 1 n which Mg was doped, fluorescence intensity decreased extremely by setting x to 0.6. In example 13 in which Ti was doped as an afterglow reduction dopant, high fluorescence intensity and low afterglow intensity were obtained like the example in which Mg was doped. Similarly, in comparative example 10 in which Ti was doped, fluorescence intensity became low by setting z to 0.018. In comparative example 11, fluorescence intensity became low and afterglow intensity became high by setting u to 0.7. In example 14, in which Sc was doped as an afterglow reduction element, fluorescence intensity became high and afterglow intensity became low, like the examples in which Mg or Ti was doped. In example 15, Mg and Sc are doped simultaneously, and, in example 16, Mg, Ti and Sc are doped simultaneously, respectively. Thus, even when two or more species of afterglow reduction elements are doped simultaneously, fluorescence intensity became high, and afterglow intensity became low. In example 17, z was set to 0.01, that was larger than examples 11-16, and fluorescence intensity became high and afterglow intensity became low similarly. In example 18, although Y was used as L, fluorescence intensity became high and afterglow intensity became low like the case where Lu was used as L, and afterglow intensity was low. In the Example 19, although both Lu and Y were doped simultaneously as L, similar characteristics were obtained as examples in which either Lu or Y was doped. Example 20, which was polycrystal with same composition as example 12, had a less fluorescence

What is claimed is:

1. A method of manufacturing a fluorescent material used for an X-ray detector, the method comprising:
    growing a fluorescent material from a liquid phase, wherein said fluorescent material is composed of a single crystal with garnet structure comprising Gd, Al, Ga, and O, and also comprising Ce as an activator,
    wherein atomic ratios of Gd, Ga, Al, and Ce are in the range of; Ga/(Gd+Ga+Al+Ce) is 0.2-0.3, Al/(Gd+Ga+Al+Ce) is 0.35-0.4, Ce/(Gd+Ga+Al+Ce) is 0.0005-0.006, and
    wherein atmosphere during said growth is composed of a gas comprising a mixture of oxygen and inactive gas.

2. The method of manufacturing a fluorescent material according to claim 1,
    wherein oxygen concentration of said atmosphere is 0.01-50 vol %.

3. A radiation detector comprising:
    a scintillator which absorbs radiation and emits light, and
    a photodetector which detects said emitted light,
    wherein said scintillator is made of a fluorescent material manufactured by the method according to claim 1.

4. The radiation detector according to claim 3, wherein a thickness of said fluorescent material is about 0.5-10 mm.

5. An X-ray CT scanner comprising:
    an X-ray source which emits X-rays, and
    an X-ray detector which faces said X-ray source,
    wherein said X-ray detector comprises the radiation detector according to claim 3.

6. The method of manufacturing a fluorescent material according to claim 1, wherein the Czochralski (CZ) method is used to obtain the single crystal from the liquid phase.

* * * * *